US006199019B1

(12) United States Patent
Iino et al.

(10) Patent No.: US 6,199,019 B1
(45) Date of Patent: Mar. 6, 2001

(54) UNSTEADY SIGNAL ANALYZER AND MEDIUM FOR RECORDING UNSTEADY SIGNAL ANALYZER PROGRAM

(75) Inventors: Yutaka Iino, Kawasaki; Masanori Yukitomo, Yokohama, both of (JP)

(73) Assignees: Kabushiki Kaisha Toshiba, Kawasaki; Toshiba Elevator Co., Ltd., Tokyo-to, both of (JP)

( * ) Notice: Subject to any disclaimer, the term of this patent is extended or adjusted under 35 U.S.C. 154(b) by 0 days.

(21) Appl. No.: 09/068,479

(22) PCT Filed: Sep. 12, 1997

(86) PCT No.: PCT/JP97/03229

§ 371 Date: Aug. 17, 1998

§ 102(e) Date: Aug. 17, 1998

(87) PCT Pub. No.: WO98/11417

PCT Pub. Date: Mar. 19, 1998

(30) Foreign Application Priority Data

Sep. 13, 1996 (JP) .......... 8-291310

(51) Int. Cl.[7] .......... G01B 5/30; G01R 23/00

(52) U.S. Cl. .......... 702/35; 702/33; 702/41; 702/66; 702/109; 702/113; 73/862.193; 73/862.381

(58) Field of Search .......... 702/35, 75, 76, 702/73, 106, 66, 105, 113, 109, 115, 33, 34, 77, 41; 356/359; 73/658, 663, 152.59, 152.49, 862.193, 862.381

(56) References Cited

PUBLICATIONS

Rolf Isermann, Automatica, vol. 29, No. 4, pp. 815–835, "Fault Diagnosis of Machines Via Parameter Estimation and Knowledge Processing", 1993.

Yves Meyer, Book: Society for Industrial and Applied Mathematics, pp. 1–126, "Wavelets Algorithms and Applications", 1993.

*Primary Examiner*—Marc S. Hoff
*Assistant Examiner*—Hien Vo
(74) *Attorney, Agent, or Firm*—Oblon, Spivak, McClelland, Maier & Neustadt, P.C.

(57) ABSTRACT

An unsteady signal analyzer for detecting a defect in a monitored object through the analysis of an unsteady signal generated by the monitored object has a wavelet transform calculating device which produces a wavelet spectrum data through a wavelet transform of the unsteady signal, a state variation function setting device which sets a state variation function representing a variation of a specific state variable of the monitored object with time, and a time coordinate nonlinear transformation device which transforms a time coordinate of the wavelet spectrum data nonlinearly into a coordinate of the specific state variable by using an inverse function of the state variation function.

20 Claims, 21 Drawing Sheets

TIME-STATE CONVERSION TABLE

TIME DEPENDENCE

SPEED DEPENDENCE

ACCELERATION SIGNAL

TIME (sec)

POWER SPECTRUM OBTAINED THROUGH THE FOURIER TRANSFORM OF THE ACCELERATION SIGNAL x (t)

FREQUENCY (Hz)

UNSTEADY SIGNAL ANALYZER AND MEDIUM FOR RECORDING UNSTEADY SIGNAL ANALYZER PROGRAM

BACKGROUND OF THE INVENTION

The present invention relates to a unsteady signal analyzer for analyzing an unsteady signal generated by a monitored object, such as a mechanical system, a process or the like and, more specifically, to an unsteady signal analyzer for analyzing an unsteady signal generated by an elevator, and a recording medium storing an analysis program for analyzing an unsteady signal generated by a monitored object using of a computer.

DISCUSSION OF THE BACKGROUND

There have been proposed various diagnostic systems which measure a signal generated by a monitored object, such as a mechanical system, a process or the like, by a measuring instrument, analyze data represented by a measured signal to detect a defect in the monitored object, and, if any defect is detected, warn the operator or the user of the defect.

Generally, most of these known diagnostic systems convert the data represented by the signal generated by the monitored object into a spectrum by Fourier transform and monitor the spectrum or estimate a characteristic model by a system identification method on the basis of data given to and provided by the monitored object. However, it has been impossible to obtain a spectrum through the Fourier transform of an unsteady signal representing data measured while the monitored object is in an unsteady state in which the operating state of the monitored object varies sharply or to determine a characteristic model through system identification.

A wavelet analytical method which uses wavelet transform has attracted attention as a method of detecting a defect in a monitored object through the analysis of an unsteady signal. The wavelet analytical method will be explained hereinafter.

Fourier transform of a signal x(t) provided by a monitored object is expressed by:

$$F(j\omega)=\int_{-\infty}^{\infty}x(t)e^{-j\omega t}\,dt \qquad (1)$$

Wavelet transform of the same signal x(t) is expressed by:

$$wt(a,b)=\int_{-\infty}^{\infty}\frac{1}{\sqrt{|a|}}\phi\left(\frac{t-b}{a}\right)x(t)\,dt \qquad (2)$$

where $\phi(\cdot)$ is a basis function called mother wavelet for transform. Fourier transform is equivalent to wavelet transform in which the basis function $\phi(t)=e^{-jt}$, b=0 and $a=\omega^{-1}$ and the basis function is a function of time continuous from a past point of infinity to a future point of infinity as shown in FIG. 2*a*. Therefore, a spectrum obtained through Fourier transform is a function of one variable, i.e., frequency, as shown in FIG. 2*b* by way of example and it is impossible to determine time dependence of the spectrum, i.e., the feature of which part of observed data is represented by the spectrum. In this article, wavelet transform uses a Gabor function expressed by:

$$\phi(t)=e^{-(t/T)^2}e^{-jt} \qquad (3)$$

as a basis function, which is localized with respect to time as shown in FIG. 3*a*. Thus, the spectrum obtained by wavelet transform is a function of two variables, i.e., frequency and time. The time-dependence of the frequency components of the signal can be determined on the basis of a function of two variables as shown in FIG. 3*b* by way of example.

As mentioned above, wavelet transform is able to extract the spectral distribution of observed data at every moment. Therefore, wavelet transform is considered to be as an effective means for analyzing an unsteady signal representing the operating condition of a monitored object varying with time.

The foregoing conventional diagnostic system, however, simply subjects the unsteady signal generated by the monitored object to wavelet transform, and hence the result of analysis indicates only the time-dependence of the frequency spectrum. Therefore, the conventional diagnostic system is an imperfect analytical technique for diagnosing the state of the monitored object.

For example, it is impossible to understand how the result of analysis made by the conventional diagnostic system, as shown in FIG. 3*b*, is related with the variation of the state of the monitored object.

SUMMARY OF THE INVENTION

With these problems in mind, therefore, it is the object of the present invention to provide an unsteady signal analyzer which can diagnose an unsteady state of a monitored object accurately by analyzing an unsteady signal generated by the monitored object.

An unsteady signal analyzer according to a first aspect of the present invention for analyzing an unsteady signal generated by a monitored object comprises: wavelet transform calculating means for producing a wavelet spectrum data through a wavelet transform of the unsteady signal; state variation function setting means for setting a state variation function representing a variation of a specific state variable of the monitored object with time; and time coordinate nonlinear transformation means for transforming a time coordinate of the wavelet spectrum data nonlinearly into a coordinate of the specific state variable by using an inverse function of the state variation function set by the state variation function setting means.

An unsteady signal analyzer according to a second aspect of the present invention for analyzing an unsteady signal representing an acceleration of a cab of an elevator as a monitored object comprises: wavelet transform calculating means for producing a wavelet spectrum data through a wavelet transform of the unsteady signal representing a measured acceleration of the cab; state variation function setting means for setting a state variation function representing a variation of vertical position or vertical speed as a state variable of the cab with time; and time coordinate nonlinear transformation means for transforming a time coordinate of the wavelet spectrum data nonlinearly into a coordinate of the vertical position or the vertical speed by using an inverse function of the state variation function set by the state variation function setting means.

In the unsteady signal analyzer according to the first or the second aspect of the present invention, the time coordinate nonlinear transformation means transforms the time coordinate of the wavelet spectrum data nonlinearly into the coordinate of the specific state variable by using the following expression:

$$wt(a, b) = \int_{z(-\infty)}^{z(\infty)} \frac{1}{\sqrt{|a|}} \phi\left(\frac{t(z-b)}{a}\right) x(t(z)) \frac{dt(z)}{dz} dz$$

which is expressing an extended wavelet transform.

In any one of the foregoing unsteady signal analyzers according to the present invention, the time coordinate nonlinear transformation means divides the wavelet spectrum data with respect to time into data segments, rearranges the data segments in order of magnitude of the state variable on the basis of a data table showing the relation between time and the state variable, or the state variation function, and estimates intermediate values of the data segments by interpolation and smoothing techniques, so as to transform the time coordinate of the wavelet spectrum data nonlinearly into the coordinate of the specific state variable.

Any one of the foregoing unsteady signal analyzers according to present invention further comprises a response data measuring means for measuring the unsteady signal.

In any one of the foregoing unsteady signal analyzers according to the present invention, the state variation function setting means may estimate the state variation function on the basis of measured data on a state variable of the monitored object other than the specific state variable.

The measured data on the state variable of the monitored object other than the specific state variable may be measured data on the unsteady signal.

In any one of the foregoing unsteady signal analyzers according to the present invention, the state variation function setting means may estimate the state variation function through an estimation of a variation of the specific state variable with time on the basis of the measured data on the state variable of the monitored object other than the specific state variable by using a state observer system based on a dynamic characteristic model of the monitored object or a Kalman filter.

In any one of the foregoing unsteady signal analyzers according to the present invention, the state variation function setting means may determine the state variation function on the basis of measured data on the specific state variable.

In any one of the foregoing unsteady signal analyzers according to the present invention, the state variation function used by the state variation function setting means is determined beforehand.

Any one of the foregoing unsteady signal analyzers according to the present invention may further comprise a display means for displaying the results of analysis made by the time coordinate nonlinear transformation means on a coordinate system indicating at least coordinates of the specific state variable and the frequency.

Any one of the foregoing unsteady signal analyzers according to the present invention may further comprise a defect detecting means for detecting a defect in the monitored object on the basis of the results of analysis made by the time coordinate nonlinear transformation means.

The unsteady signal analyzer according to the present invention may further comprise a region specifying means for specifying a specific region in the spectrum obtained as a result of analysis by the time coordinate nonlinear transformation means and displayed on the display means, and a data extracting means for extracting data on a portion of the wavelet spectrum, in the specific region specified by the region specifying means, and sending the extracted data on the portion of the wavelet spectrum to a defect detecting means.

The unsteady signal analyzer according to the present invention may display a result of detection made by the defect detecting means on the display means.

The unsteady signal analyzer according to the present invention may further comprise a defect display means for displaying a result of detection made by the defect detecting means.

A recording medium according to a third aspect of the present invention stores an unsteady signal analyzing program defining a procedure for analyzing an unsteady signal generated by a monitored object, to be carried out by a computer, said unsteady signal analyzing program makes the computer exercise: a wavelet transform calculating function of producing a wavelet spectrum data through a wavelet transform of the unsteady signal, a state variation function setting function of setting a state variation function representing a variation of a specific state variable of the monitored object with time, and a time coordinate nonlinear transformation function of transforming a time coordinate of the wavelet spectrum data nonlinearly into a coordinate of the specific state variable by using an inverse function of the state variation function.

In the recording medium according to the third aspect of the present invention storing the unsteady signal analyzing program, the monitored object is an elevator, the unsteady signal is an acceleration signal representing the measured acceleration of a cab included in the elevator, and the specific state variable is vertical position or vertical speed of the cab.

In the recording medium according to the third aspect of the present invention storing the unsteady signal analyzing program, the time coordinate nonlinear transformation function carries out the nonlinear transformation of the time coordinate of the wavelet spectrum data by using following expression:

$$wt(a, b) = \int_{z(-\infty)}^{z(\infty)} \frac{1}{\sqrt{|a|}} \phi\left(\frac{t(z-b)}{a}\right) x(t(z)) \frac{dt(z)}{dz} dz$$

which is expressing an extended wavelet transform.

In the recording medium according to the third aspect of the present invention storing the unsteady signal analyzing program, the time coordinate nonlinear transformation function divides the wavelet spectrum data with respect to time into data segments, rearranges the data segments in order of magnitude of the state variable on the basis of a data table showing the relation between time and the state variable, or the state variation function, and estimates intermediate values of the data segments by interpolation and smoothing techniques, so as to transform the time coordinate of the wavelet spectrum data nonlinearly into the coordinate of the specific state variable.

The present invention can diagnose an unsteady state of the monitored object accurately by getting the correlation and the causal relationship between the specific state variable of the monitored object and the frequency changes.

DESCRIPTION OF THE PREFERRED EMBODIMENTS

Figure 1:
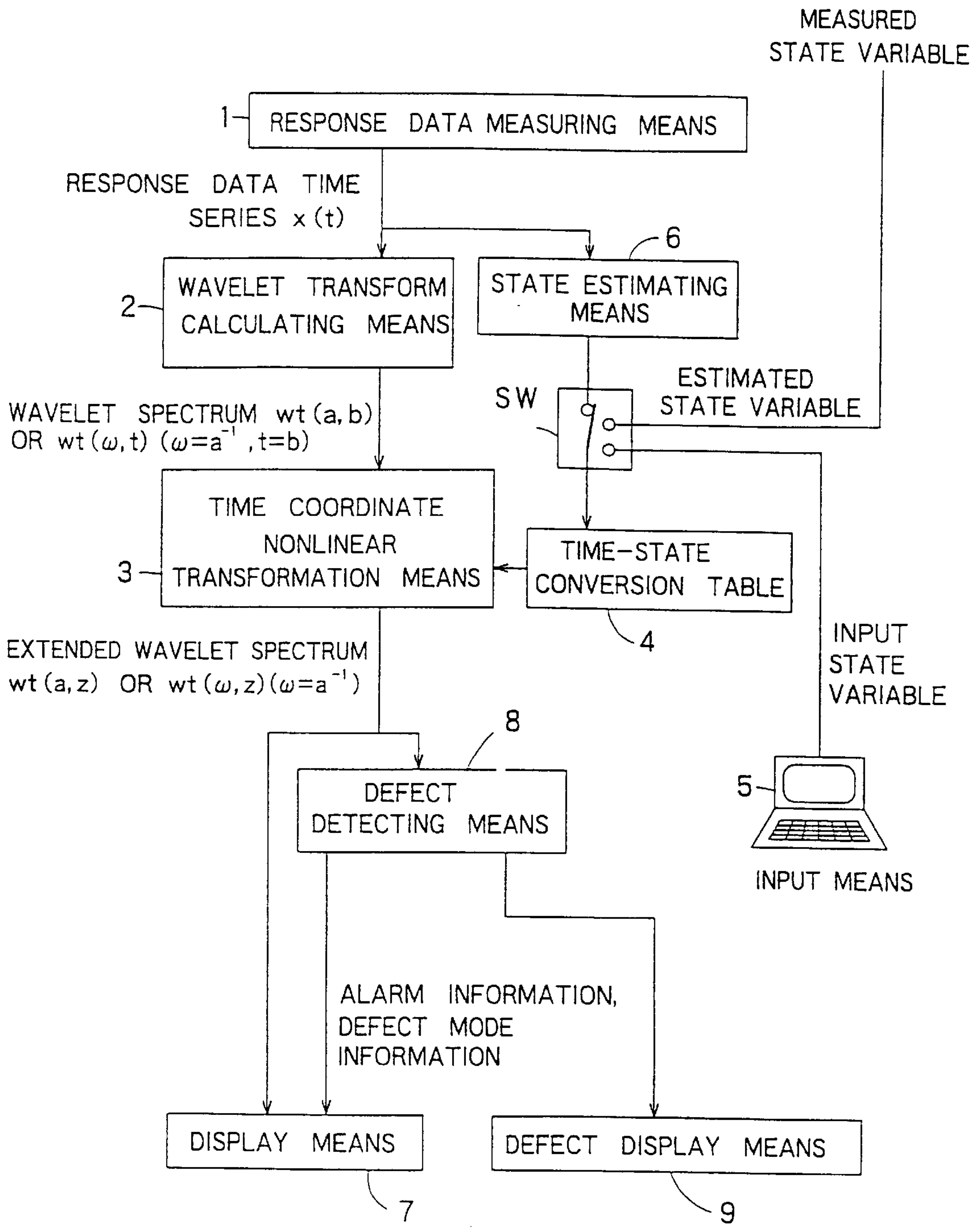
FIG. 1 is a block diagram of an unsteady signal analyzer in a preferred first embodiment according to the present invention.
Figure 2A:
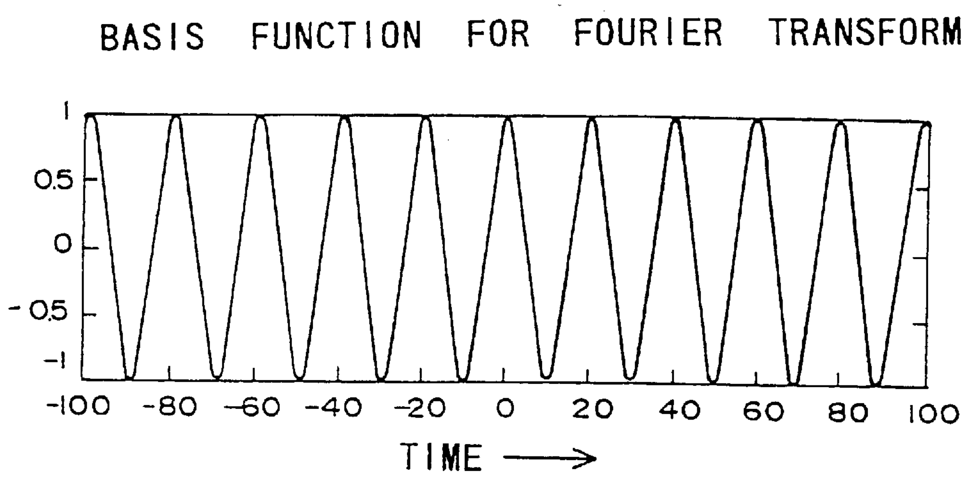
FIGS. 2*a* and 2*b* are graphs of a basis function for Fourier transform and a power spectrum produced through Fourier transform, respectively.
Figure 2B:
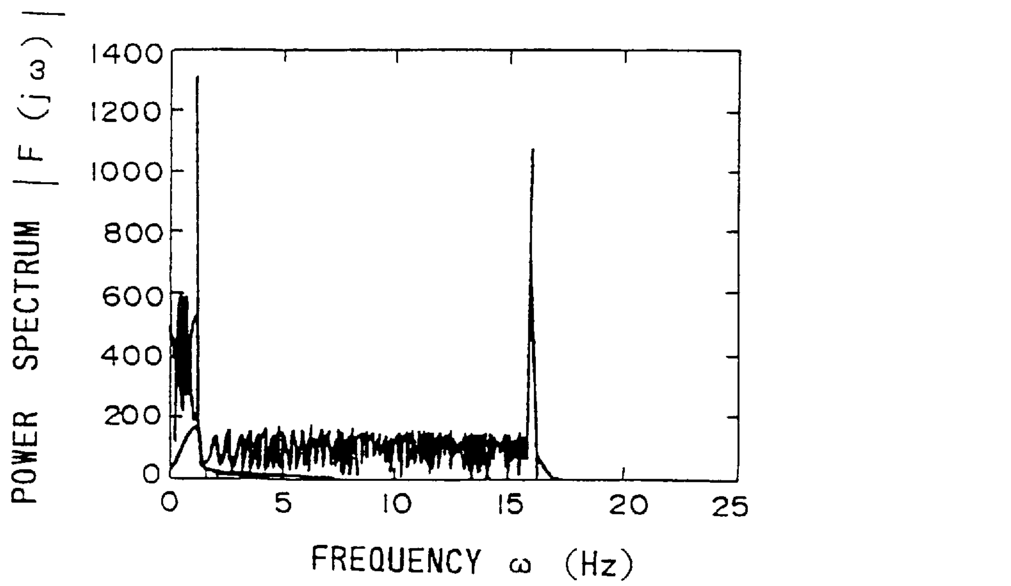
Figure 3A:
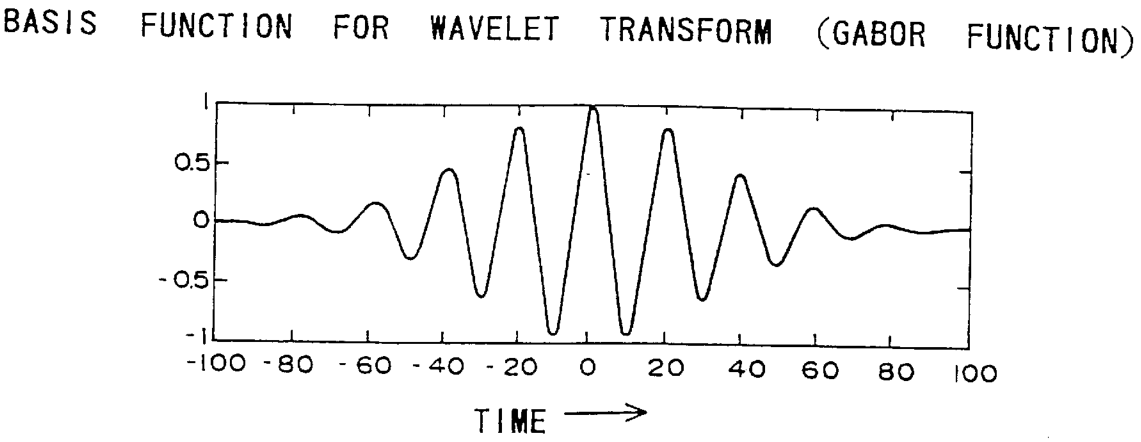
FIGS. 3*a* and 3*b* are graphs of a basis function for wavelet transform and a wavelet power spectrum produced through wavelet transform, respectively.

An unsteady signal analyzer in a preferred first embodiment according to the present invention will be described with reference to FIGS. 1, 3*a*, 3*b*. Referring to FIG. 1, the unsteady signal analyzer embodying the present invention has a response data measuring means 1 comprising a sensor, an A/D converter and noise filters.

An unsteady signal x(t), i.e., a time series of response data, received by the response data measuring means 1 is given to a wavelet transform calculating means 2 which carries out calculation by using, for example, the foregoing Expression (2) representing wavelet transform.

$$wt(a,b)=\int_{-\infty}^{\infty}\frac{1}{\sqrt{|a|}}\phi\left(\frac{t-b}{a}\right)x(t)\,dt \tag{2}$$

In Expression (2), a is the reciprocal of frequency ω, and b is time t.

Figure 3B:
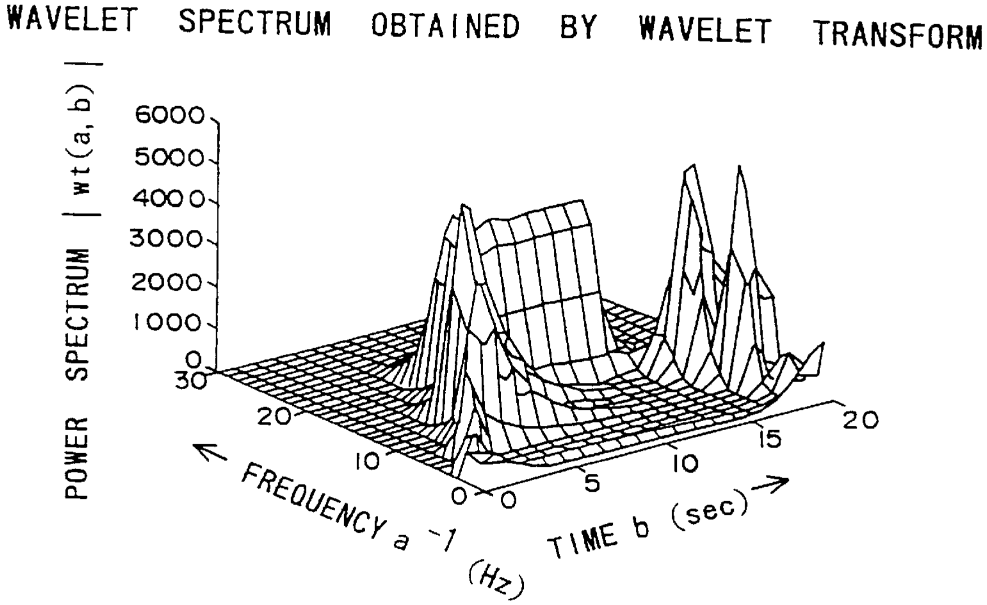

The wavelet transform calculating means 2 carries out the wavelet transform of the unsteady cab acceleration signal x(t) by using Expression (2) to provide a wavelet spectrum (wavelet transform data) wt(a,b) shown in FIG. 3*b*. Then, the wavelet transform calculating means 2 gives the wavelet spectrum wt(a,b) to a time coordinate nonlinear conversion means 3. The time coordinate nonlinear transformation means 3 transforms the time coordinate of the wavelet spectrum wt(a,b) by nonlinear coordinate transformation with respect to a specific state variable (physical value) of a monitored object.

If the unsteady signal measured by the response data measuring means 1 represents acceleration, the specific state variable is, for example, speed or position, which will be described in detail later in connection with the application of the unsteady signal analyzer to an elevator and a railroad car.

The unsteady signal analyzer has a time-state conversion table 4 tabulating state variation function data $\{z(t_1), z(t_2), \ldots, z(t_N)\}$ representing the relation between time and the specific state variable. The time-state conversion table 4 and following state estimating means 6 constitute a state variation function setting means for setting a state variation function representing the variation of a specific state variable of the monitored object with respect to time.

There are several methods available for obtaining the state variation function data $\{z(t_1, z(t_2), \ldots, z(t_N)\}$. The unsteady signal analyzer in this embodiment has an input means 5 for writing previously determined state variation function data $\{z(t_1, z(t_2), \ldots, z(t_N)\}$ to the time-state conversion table 4.

The state variation function data $\{z(t_1, z(t_2), \ldots, z(t_N)\}$ can be directly obtained by directly measuring a specific state variable z, such as speed, varying with time or by estimating the variation of the specific state variable z, such as speed, with time on the basis of measured data of a state variable, such as acceleration, other than the specific state variable z, such as speed.

The latter method of estimating the variation of the specific state variable z with time on the basis of the measured data on a state variable other than the specific state variable is carried out by the state estimating means 6 shown in FIG. 1, which will be described later in connection with the description of a modification of the unsteady signal analyzer of FIG. 1.

The time coordinate nonlinear transformation means 3 reads the state variation function data $\{z(t_1, z(t_2), z(t_N)\}$ from the time-state conversion table 4, and transforms the time coordinate b of the wavelet spectrum wt(a,b) into the coordinate of the state variable z.

More specifically, the time coordinate nonlinear transformation means 3 produces the inverse function t(z) of a function z(t) (state variation function), i.e., a function of t representing the specific state variable z, and executes the variation of variables on the basis of the inverse function t(z) to change time t of Expression (2), i.e., wavelet transform expression, for the specific state variable z to obtain Expression (4).

$$wt(a, b) = \int_{z(-\infty)}^{z(\infty)} \frac{1}{\sqrt{|a|}} \phi\left(\frac{t(z-b)}{a}\right) x(t(z)) \frac{dt(z)}{dz} dz \qquad (4)$$

Transform expressed by Expression (4) will be referred to as extended wavelet transform for convenience. An extended wavelet spectrum wt(a,z) indicating the variation of frequency relative to the specific state variable z can be obtained by changing the time coordinate b of the wavelet spectrum wt(a,b) for the coordinate of the specific state variable z by using Expression (4) for extended wavelet transform.

In the following description, the aforesaid wavelet spectrum wt(a,b) will be expressed by wt(ω,b), $wt(a^{-1},b)$ with using $\omega=a^{-1}$, in order to clarify the point that the spectrum is a function of a frequency ω. Moreover, the conventional wavelet spectrum will be expressed by wt(ω,t), and the extended wavelet spectrum will be expressed by wt(ω,z) for discrimination between the conventional wavelet spectrum and the extended wavelet spectrum.

The extended wavelet spectrum wt(ω,z) obtained by changing time coordinate for state variable coordinate can be obtained also by dividing a wavelet spectrum wt(ω,t) obtained by conventional wavelet transform into data segments $\{wt(\omega,t_1), wt(\omega,t_2) \ldots, wt(\omega,t_n)\}$ for times $\{t_1, t_2, \ldots, t_n\}$, rearranging the data segments $\{wt(\omega,t_1), wt(\omega,t_2) \ldots, wt(\omega,t_n)\}$ in order of magnitude of the state variable z, and estimating intermediate values between the data segments by interpolation.

The time coordinate nonlinear transformation means 3 sends the extended wavelet spectrum wt(a,z) to a display means 7. The display means 7 displays a function wt(ω,z) of two variables, i.e., frequency $\omega=a^{-1}$ (or the reciprocal a of $a^{-1}$),and state variable z, i.e., an extended wavelet spectrum (wavelet analytical data) on the basis of the extended wavelet spectrum wt(a,z). More specifically, for example, {ω, z, |wt(ω,z)|} or {ω, z, (wt(ω,z)} is displayed in a three-dimensional graph on a display. A notation, |a| designates the absolute value of a, and a notation, <a designates the phase angle of a.

The unsteady signal analyzer has a defect detecting means 8 for automatically detecting defects in the monitored object from the extended wavelet spectrum provided by the time coordinate nonlinear transformation means 3. The defect detecting means 8 decides automatically whether or not the monitored object is normal by a predetermined defect diagnosing system. If the defect detecting means 8 decides that a defect exists in the monitored object, the defect detecting means 8 sends an alarm signal or a defective mode signal to the display means 7 to warn the operator of the defect.

The predetermined defect diagnosing system uses a threshold method of diagnosing defects by using a power spectrum of a specific portion of the extended wavelet spectrum wt(ω,z), i.e., $\{|(wt(\omega_1,z_1)|, \ldots, |wt(\omega_m,z_m)|\}$, and a threshold condition expressed by:

$$\text{If } (|wt((\omega_i,z_i)|>\epsilon_i), \text{ then defective i} \qquad (5)$$

or a composite means. The result of detection by the defect detecting means 8 may be displayed on a defect information display means 9 specially for displaying information on a defect in addition to displaying the same on the display means 7.

A desired region may be specified in the extended wavelet spectrum, i.e., the result of analysis made by the time coordinate nonlinear transformation means 3, displayed by the display means 7 by the operator by means of a pointing device or the like, only the extended wavelet spectrum corresponding to the specified region may be given to the defect detecting means 8, and the defect detecting means 8 may detect a defect in the monitored object by using only the extended wavelet spectrum given thereto.

Thus, a direct analytical operation can be achieved without being affected by noise, disturbance and other adverse factors included in regions other than the specified region and the accuracy of defect detection can be improved by analyzing only a characteristic defect included in the extended wavelet spectrum displayed on the display means 7 and extracted by the operator.

As is apparent from the foregoing description, the unsteady signal analyzer embodying the present invention produces the wavelet spectrum through the wavelet transform of the unsteady signal representing the state of the monitored object, and transforms the time coordinate of the wavelet spectrum into the coordinate of the specific state variable. Therefore, the correlation and the causal relationship between the specific state variable, such as position, speed or acceleration in a mechanical system, and the frequency spectrum can be easily determined as well as the variation of the frequency spectrum with time.

Accordingly, if any defect is found in the monitored object, the defect can be analyzed and the result of analysis easily understandable from the viewpoint of physical laws can be displayed, and the position of the defect in the monitored object can be easily located.

Furthermore, the unsteady signal analyzer embodying the present invention is capable of analyzing varying spectral distribution under an unsteady state in which the operating condition and the internal condition of the monitored object change frequently. Thus, the unsteady signal can be very effectively analyzed and, consequently, small, fragmentary data can be effectively analyzed.

Figure 4:
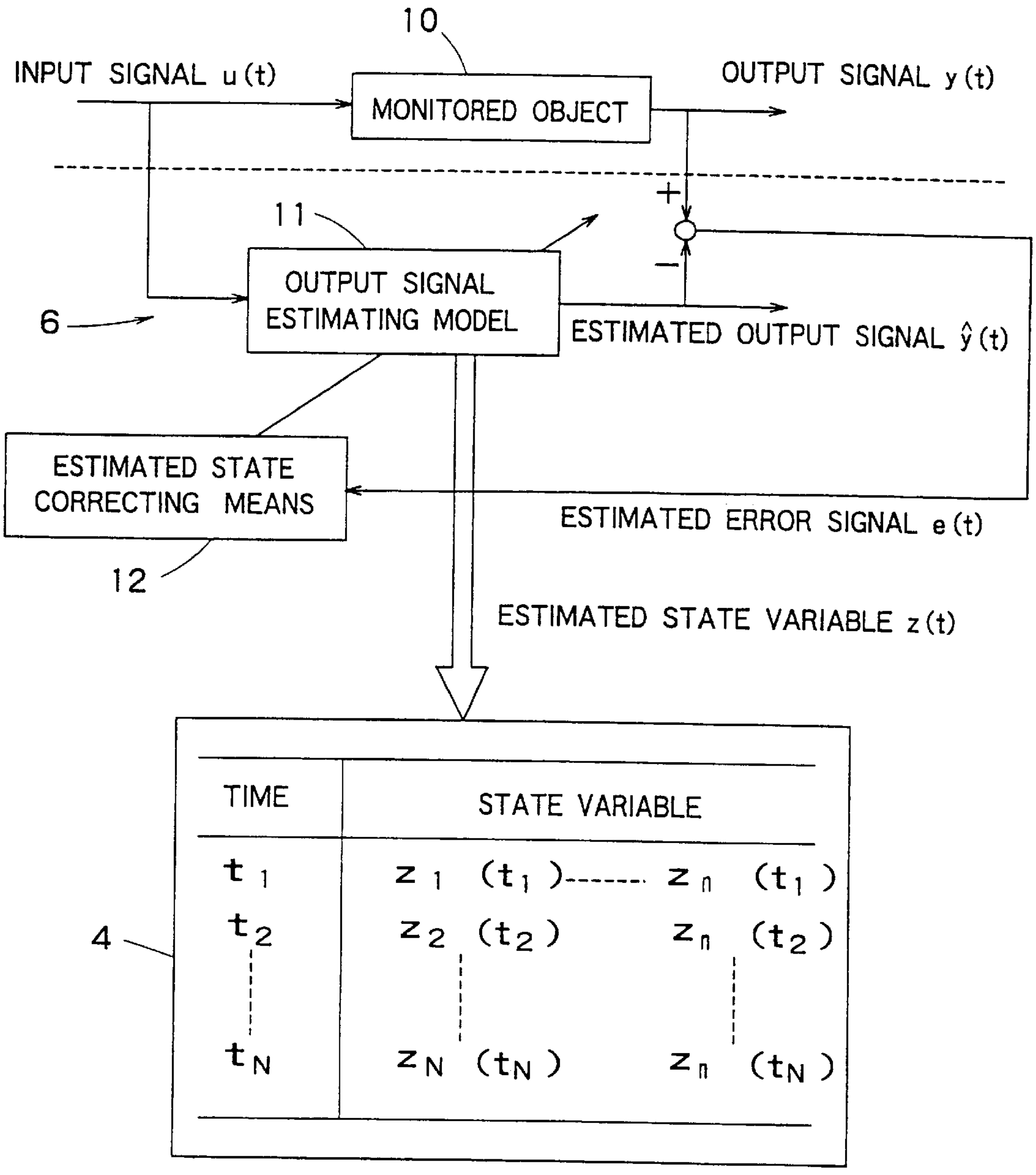
FIG. 4 is a block diagram of an unsteady signal analyzer in a modification of the unsteady signal analyzer of FIG. 1.

Modification FIG. 4 shows an unsteady signal analyzer in a modification of the foregoing unsteady signal analyzer embodying the present invention. The unsteady signal analyzer in the modification produces state variation function data $\{z(t_1), z(t_2), \ldots, z(t_N)\}$ to be written to the time-state conversion table 4 through estimation by the state estimating means 6 on the basis of measured data on a state variable other than the specific state variable z.

This method of producing the state variation function data is very effective under a condition where the direct measurement of the specific state variable z is impossible.

In this modification, the state estimating means 6 estimates the variation of the specific state variable z with respect to time from measured data in a real-time mode on the basis of the dynamic characteristic model of the monitored object to produce the state variation function data $\{z(t_1), z(t_2), \ldots, z(t_N)\}$.

Referring to FIG. 4, this state estimating means 6 is able to estimate in a real time mode a specific state variable z(t) which cannot be directly measured by successively correcting an estimated state variable in an output signal estimating model 11 by an estimated state correcting means 12 on the basis of an estimated error signal e(t), i.e., the difference between an output estimated value y hat (t) provided by the output signal estimating model 11 when an input signal u(t) to the monitored object 10 is given to the output signal estimating model 11, and an actual output signal y(t).

If a Kalman filter or a state observer system is employed as the state estimating means 6, the output signal estimating model is represented by Expressions (6) and (7), and the estimated state correcting means 12 is represented by Expression (8).

$$z(k|k-1)=Az(k-1|k-1)+Bu(k-1) \quad (6)$$

$$\hat{y}(k|k-1)=Cz(k|k-1) \quad (7)$$

$$z(k|k)=z(k|k-1)+K(y(k)-\hat{y}(k|k-1)) \quad (8)$$

where A, B and C are coefficient matrices relating to the dynamic characteristic model of the monitored object, and K is Kalman gain (or the gain of the state observer system).

An internal state variable vector z(k|k) of the monitored object can be estimated from a series of observation data of the input signal u(k) to the monitored object and the output signal y(k) by the successive calculation. Some elements of the thus estimated state variable vector are extracted as the specific state variable z and the time-state conversion table 4 is produced from the time series $\{z(t_1), z(t_2), \ldots, z(t_N)\}$ of the specific state variable z.

The state variable may be estimated beforehand in an off-line processing mode or may be estimated in a real-time mode during the observation of the data.

As is apparent from the foregoing description, in this modification, the relation between the specific state variable z and the observed data spectrum can be estimated by the state estimating means 6 even if the specific state variable z cannot be directly measured. An analytical method can be easily combined with the wavelet analytical method.

Example 1

An unsteady signal analyzer embodying the present invention in Example 1 applied to an elevator, i.e., a mechanical system, as a monitored object, will be described hereinafter with reference to FIGS. 5 to 15.

An unsteady signal to be analyzed by the unsteady signal analyzer in Example 1 is an acceleration signal representing the measured acceleration of a cab included in the elevator, and the specific state variable to be employed in nonlinear transformation is the vertical position or the vertical speed of the cab.

Figure 5:
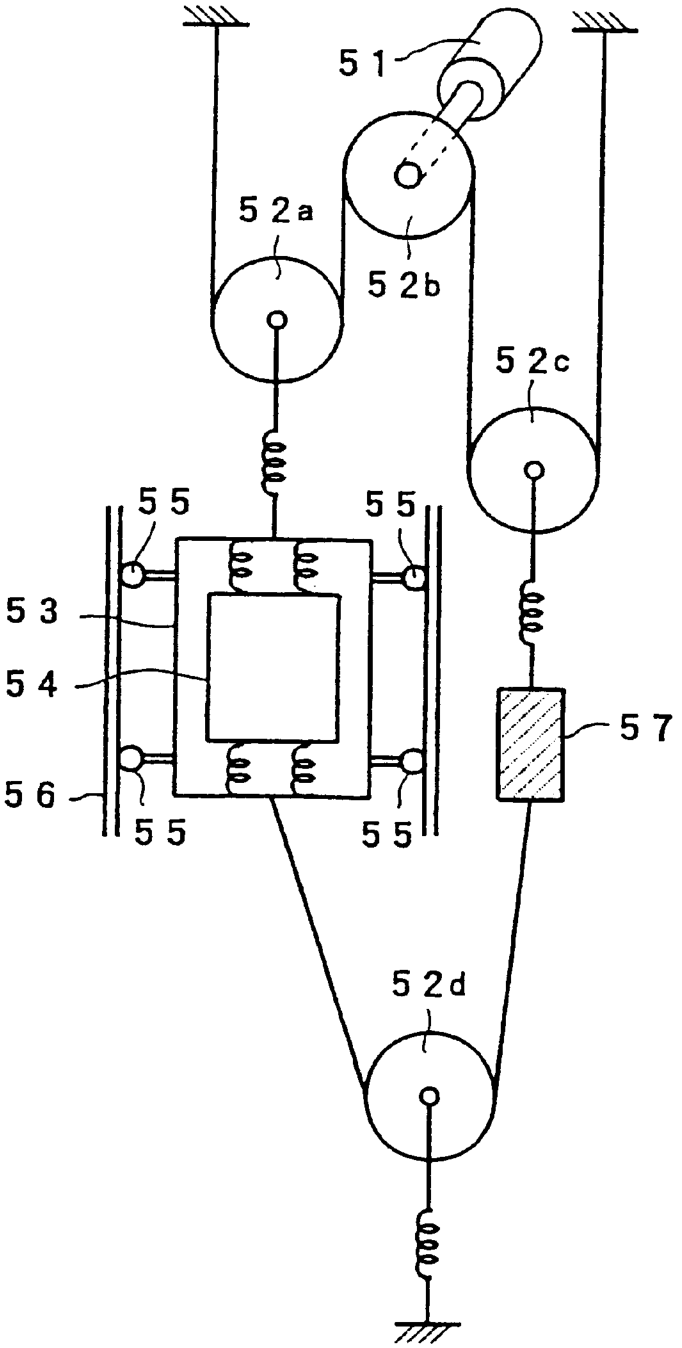
FIG. 5 is a diagrammatic view of an elevator to which the unsteady signal analyzer embodying the present invention is to be applied.

Referring to FIG. 5, the elevator, i.e., the monitored object, comprises a motor 51, sheaves **52*a*, 52*b*, 52*c* and 52*d*, a cab frame 53, a cab 54, guide rollers 55, guide rails 56 and a counterweight 57**.

Figure 6:
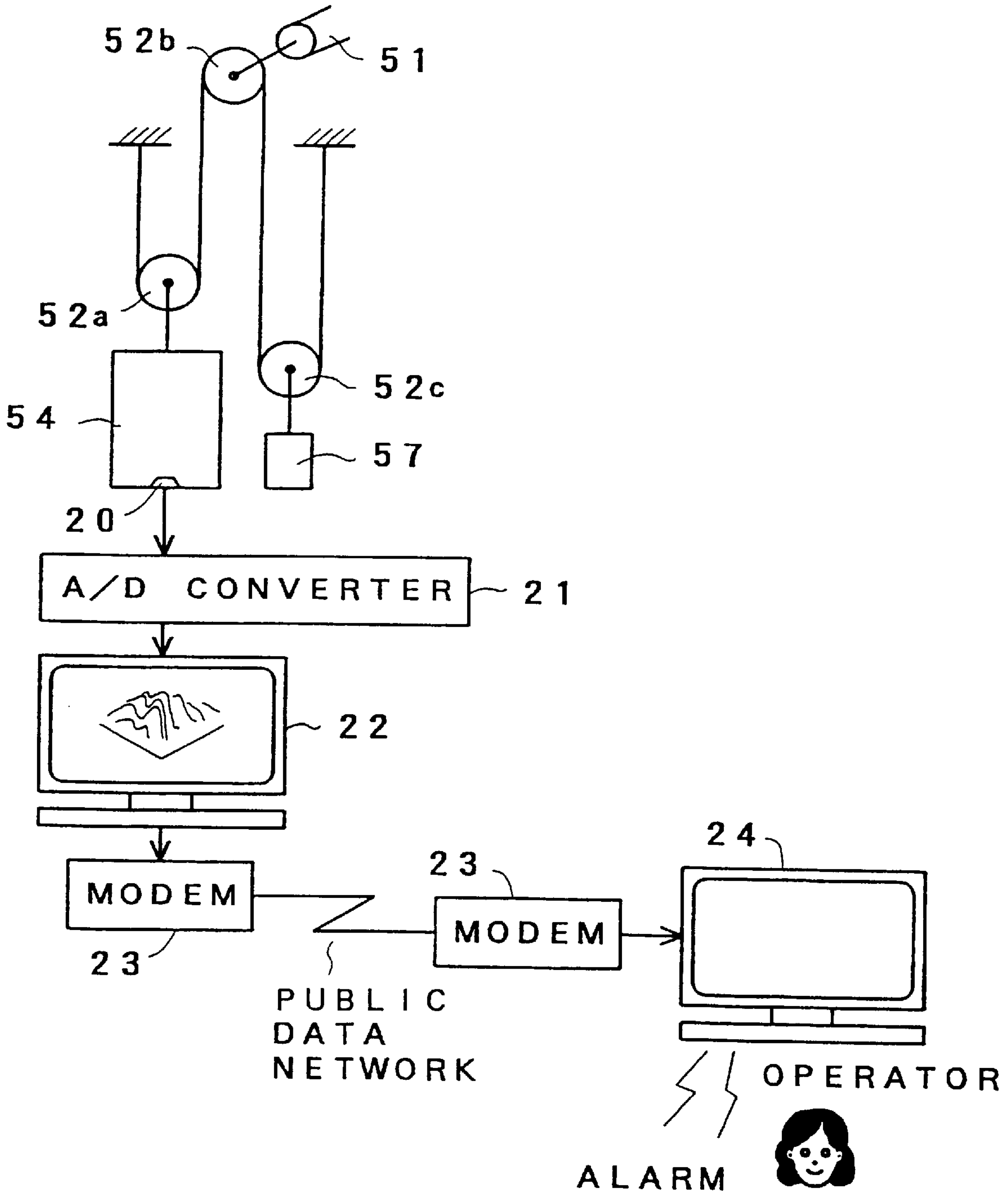
FIG. 6 is a diagrammatic view of the elevator of FIG. provided with the unsteady signal analyzer embodying the present invention.

As shown in FIG. 6, the unsteady signal analyzer is provided with an acceleration sensor 20 disposed in the cab 54. An acceleration signal representing a measured acceleration and provided by the acceleration sensor 20 is given to an A/D converter 21, the A/D converter 21 converts the acceleration signal into a corresponding digital signal and gives the digital signal to an analyzing-and-displaying device 22, such as a personal computer. The acceleration sensor 20 and the A/D converter 21 constitute the response data measuring means 1 shown in FIG. 1.

The analyzing-and-displaying device 22 carries out the procedure shown in FIG. 1 to calculate an extended wavelet spectrum, and displays the calculated extended wavelet spectrum on a screen included therein. The result of analysis or defect diagnosis is sent through MODEMs 23 and a public data network to a remote monitor station. The result is displayed on a central monitoring terminal of the monitor station and, if any defect is found, an alarm signal is generated.

Figure 7:
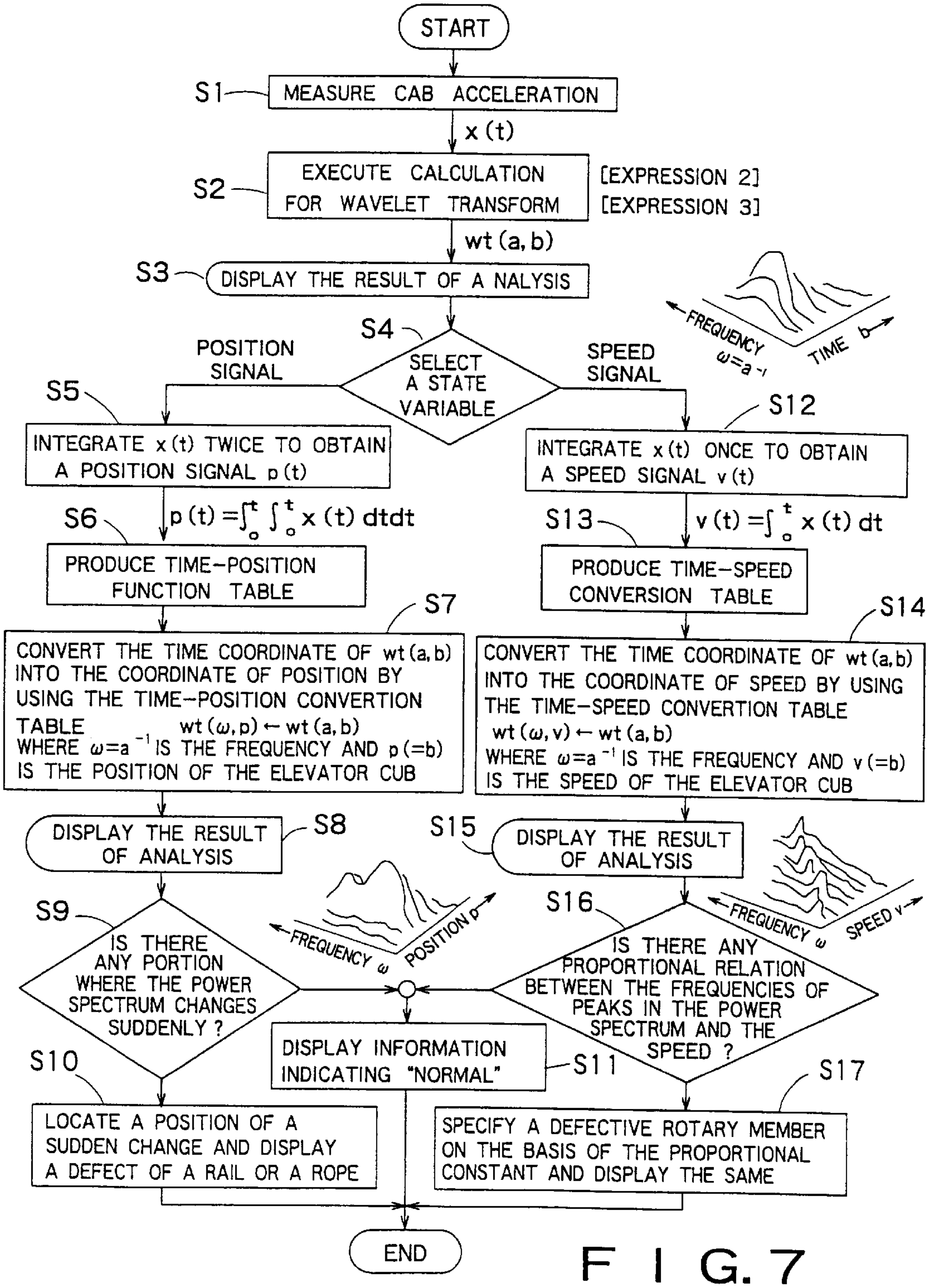
FIG. 7 is a flow chart of a diagnostic algorithm for diagnosing defects in an elevator, based on extended wavelet transform to be executed by the unsteady signal analyzer embodying the present invention.

Referring to FIG. 7 showing a procedure to be carried out by the analyzing-and-displaying device 22, the acceleration sensor 20 provides a cab acceleration signal x(t) representing the measured acceleration of the cab 54 in step 1, and a wavelet spectrum wt(a,b) is calculated on the basis of the cab acceleration signal x(t) by using Expressions (2) and (3) in step 2.

Then, the wavelet spectrum wt(a,b) or wt(ω,b), where $\omega=a^{-1}$ is the frequency of the wavelet spectrum, is displayed on a display in a graph having a time axis and a frequency axis in step 3. In step 4, the operator selects the speed or the position of the cab 54 as a specific state variable. In step 4, both steps for the speed of the cab 54 and those for the position of the cab 54 may be automatically selected.

If the position of the cab 54 is selected as the specific state variable in step 4, the cab acceleration signal x(t) is integrated twice with respect to t in step 5 to produce a cab position signal p(t). A function table showing the relation between time t and position p is produced in step 6 on the basis of cab position data $\{p(t_1), p(t_2), \ldots, p(t_N)\}$ represented by the cab position signal p(t).

Then, the time coordinate of the wavelet spectrum calculated in step 2 is transformed into the coordinate of cab position p on the basis of the function table produced in step 6 to produce an extended wavelet spectrum wt(ω,p) in step 7. In step 8, the extended wavelet spectrum wt(ω,p), i.e., the result of analysis, is displayed on a display.

In step 9, the rate of variation of the power spectrum with the cab position p is calculated by using the extended wavelet spectrum wt(ω,p) and Expression (9) shown below. The rate of change is examined to see whether or not the rate of change is higher than a threshold, and a decision is made as to whether or not the power spectrum has suddenly changed with the cab position p.

$$|wt(\omega, p(t_i))-wt(\omega,p(t_{i+1}))/p(t_i)-p(t_{i+1})|>\epsilon p \quad (9)$$

If it is decided in step 9 that the power spectrum has suddenly changed, a cab position $p(t_1)$ where the power spectrum has suddenly changed is detected and a warning indicating a defect in the rails 56 or the rope of the elevator is displayed on the display in step 10. If it is decided in step 9 that the power spectrum has not suddenly changed, a message "Normal" is displayed on the display in step 11 and the diagnostic operation is ended or the unsteady signal analyzer remains standing by until the next unsteady signal analyzing cycle.

If cab speed is selected as the state variable in step 4, a cab speed signal v(t) is produced by integrating the cab acceleration signal x(t) once in step 12. A function table showing the relation between time t and speed v is produced in step 13 on the basis of cab speed data $\{v(t_1), v(t_2), \ldots, v(t_N)\}$ represented by the cab speed signal v(t).

Then, the time coordinate of the wavelet spectrum data calculated in step 2 is transformed into the coordinate of cab speed v on the basis of the function table produced in step 13 to produce an extended wavelet spectrum data wt(ω,v) in step 14. In step 15, the extended wavelet spectrum data wt(ω,v), i.e., the result of analysis, is displayed on a display.

The spectrum data |wt(ω,v)| is compared with a threshold by using:

$$|wt(\omega_i,v_i)|>\epsilon v \quad (10)$$

to select the data of a portion having a power spectrum exceeding the threshold (peak spectrum) $\{wt(\omega_1,v_1), wt(\omega_2, v_2), \ldots, wt(\omega_m, v_m)\}$.

Supposing that the relation between frequency ω and cab speed v can be expressed by Proportional expression (11):

$$v_i=\omega_i+e_i \quad (11)$$

the following least square solution of coefficient r which makes the sum of squares of errors $e_i$, i.e., $\Sigma e_i^2$ a minimum is determined.

$$r=\frac{\sum_{i=1}^{m}\omega_i v_i}{\sum_{i=1}^{m}\omega_i^2} \quad (12)$$

If a discriminant:

$$\frac{1}{m}\sum_{i=1}^{m}\frac{|v_i-r\omega_i|^2}{1+r^2}<\varepsilon r \quad (13)$$

for a variance at a distance d from a straight line expressed by Expression (11), i.e., the proportional expression, expressing data points $\{(\omega_1,v_1), (\omega_2,v_2, ), \ldots, (\omega_m,v_m)\}$ is satisfied, it is decided in step 16 that speed v and frequency ω are strongly correlated; that is, it is decided that speed v and frequency ω are in proportional relation.

In such a case, it is decided that there is a defect in some of the rotary members, such as the motor 51, the sheaves 52*a*, 52*b*, 52*c* and 52*d* bearings and the guide rollers 55, because the frequency of variation of the torque due to the eccentricity of the rotary member is proportional to the rotating speed of the rotary member, and the cab speed is proportional to the rotating speed.

The defective rotating member is found out from the coefficient r and information is displayed on the display to that effect in step 17. For example, if r/2π is equal to the radius of the sheave, it is decided that the cause of the defect is the variation of the torque attributable to the eccentricity of the sheave from Expression (14).

Cab Speed=2π(Sheave Radius)×(Sheave Rotation Frequency) (14)

If it is decided in step 16 that speed v and frequency ω are not correlated, a message, "Normal" is displayed on the display in step 11, and the diagnostic operation is ended or the unsteady signal analyzer remains standing by until the next unsteady signal analyzing cycle.

Step 6 for executing a procedure to be carried out by the time coordinate nonlinear transformation means 3 or a coordinate transformation procedure to be executed in step 13 will be described hereinafter. In the following description, a state variable signal z(t) will be used instead of the cab position signal p(t) or the cab speed signal v(t), and it is supposed that a function table, i.e., the time-state conversion table 4, showing a data string $\{z(t_1), z(t_2), \ldots, z(t_N)\}$ is produced beforehand. Data obtained through ordinary wavelet transform is expressed by:

$$wt(a,b)=\{wt(a_i,b_j)|i=1,\ldots,n1, j=1,\ldots n2\} \quad (15)$$

Substituting the relation, $\omega=a^{-1}$ into Expression (15) to obtain data represented by:

$$wt(w,b)=\{wt(\omega_i,b_j)|\omega_i=a_i^{-1}, i=1,\ldots,n1, j=1,\ldots,n2\} \quad (16)$$

Then, corresponding state variable $z(b_i)$ is obtained by choosing $t_k$ meeting:

$$t_k\leqq b_j\leqq t_{k+1} \quad (17)$$

from $\{t_1, t_2, \ldots, t_N\}$ for the time coordinate of data elements, and carrying out an operation by using Expression (18) for linear interpolation to obtain an extended wavelet spectrum represented by Expression (19).

$$z(b_j)=z(t_k)+\frac{b_j-t_k}{t_{k+1}-t_k}(z(t_{k+1})-z(t_k)) = \frac{(b_j-t_k)z(t_{k+1})+(t_{k+1}-b_j)z(t_k)}{t_{k+1}-t_k} \quad (18)$$

$$wt(\omega,z)=\{wt(\omega_i,z(b_j))|\omega_i=a_i^{-1}, i=1,\ldots,n1, j=1,\ldots,n2\} \quad (19)$$

Another method estimates the function z(t) from the time-state conversion table 4. For example, a polynominal:

$$z(t)=z_0+z_1t+\ldots+z_Pt^P \quad (20)$$

is supposed, and the coefficients $z_0$, $z_1$, . . . , and $z_p$ are estimated from data $\{z(t_1), z(t_2), \ldots, z(t_N)\}$ by a least square method, and then the inverse function t(z) of Expression (20) is obtained.

Finally, calculation by using Expression (21) for numerical integration is carried out for the measured data represented by a cab acceleration signal x(t) to obtain an extended wavelet spectrum.

$$wt(a,b)=\int_{z(-\infty)}^{z(\infty)}\frac{1}{\sqrt{|a|}}\phi\left(\frac{t(z-b)}{a}\right)x(t(z))\frac{dt(z)}{dz}dz \quad (21)$$

FIGS. 8*a* to 15 show the results of analysis of an acceleration signal provided by the acceleration sensor 20 disposed on the cab 54 of the elevator carried out by the unsteady signal analyzer of the present invention.

Figure 8A:
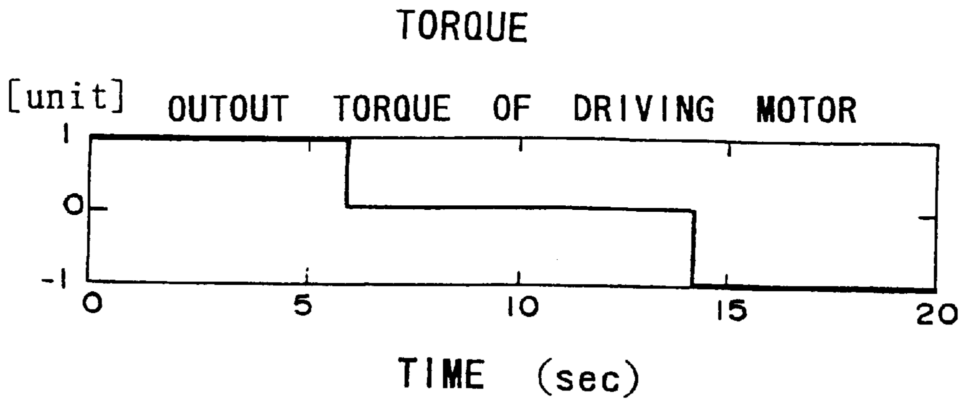
FIGS. 8*a*, 8*b* and 8*c* are graphs showing the variation with time of the output torque of a motor included in the elevator of FIG. 5, the speed of a cab included in the elevator of FIG. 5, and the position of the cab, respectively, when the output shaft of the motor is eccentric.
Figure 8B:
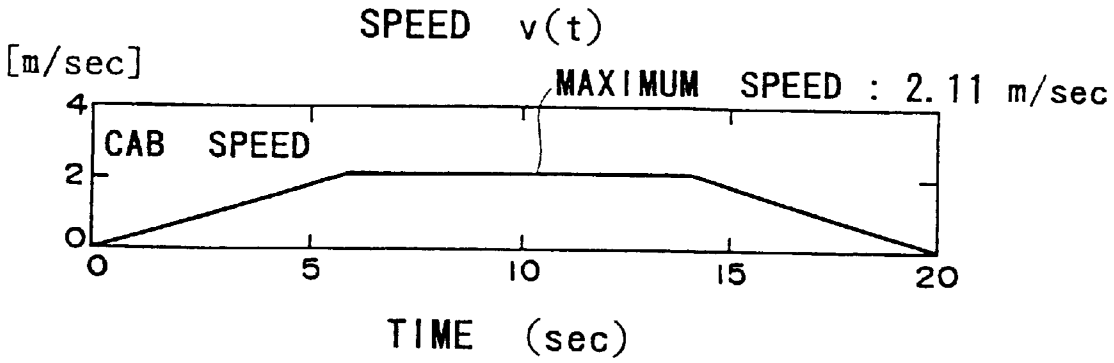
Figure 8C:
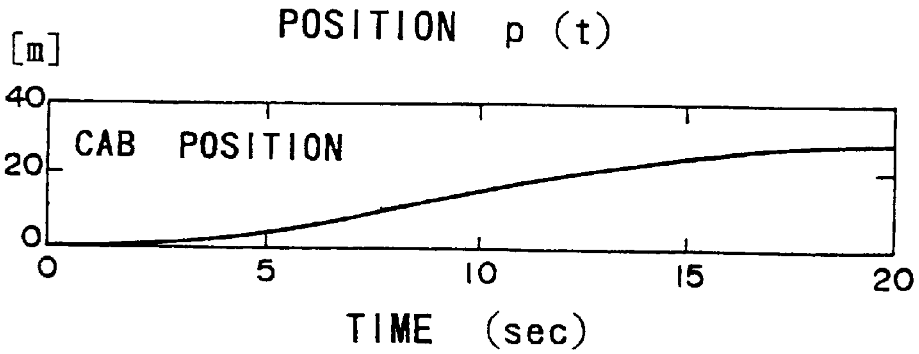

FIGS. 8*a* to 12 show data representing a case where the cab 54 generated vibrations due to irregular torque attributable to the eccentricity of the output shaft of the motor 51 of the elevator. A curve shown in FIG. 8*a* represents a required output torque of the motor 51, FIG. 8*b* shows a cab speed signal v(t) estimated by integrating a cab acceleration signal x(t), and FIG. Bc shows a cab position signal p(t) estimated by integrating the cab acceleration signal x(t) twice.

Figure 9A:
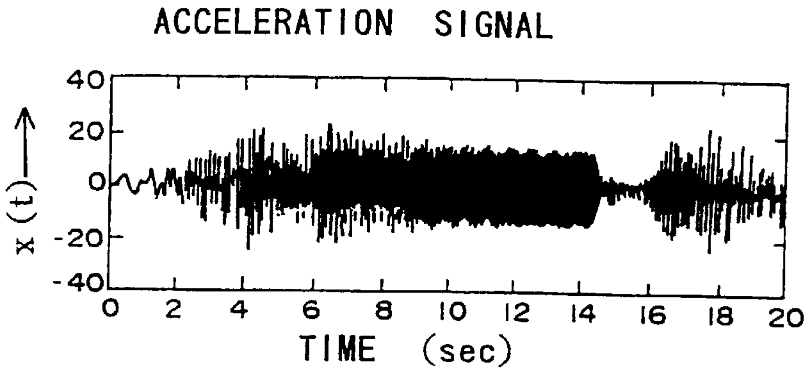
FIGS. 9*a*, 9*b* and 9*c* are graphs showing the variation of the acceleration of the cab of the elevator of FIG. 5 with time, the variation of the output torque of the motor with time and the result of Fourier transform of the acceleration of the cab, respectively, when the output shaft of the motor is eccentric.
Figure 9B:
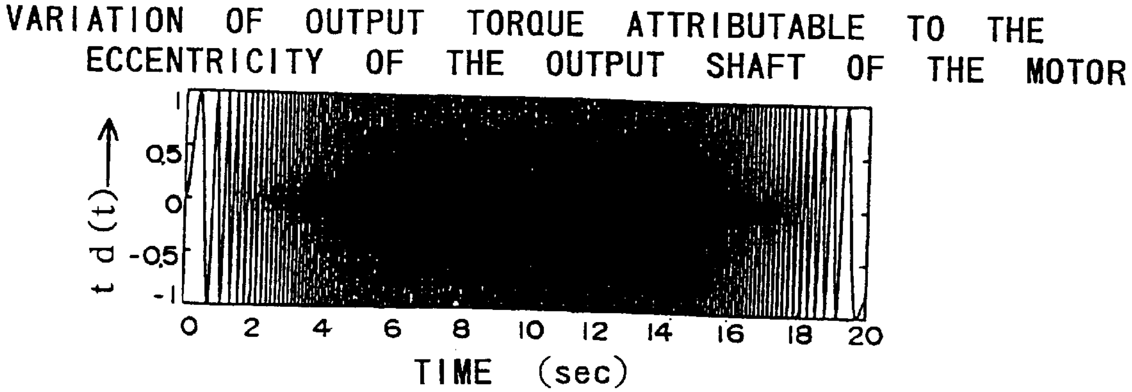
Figure 9C:
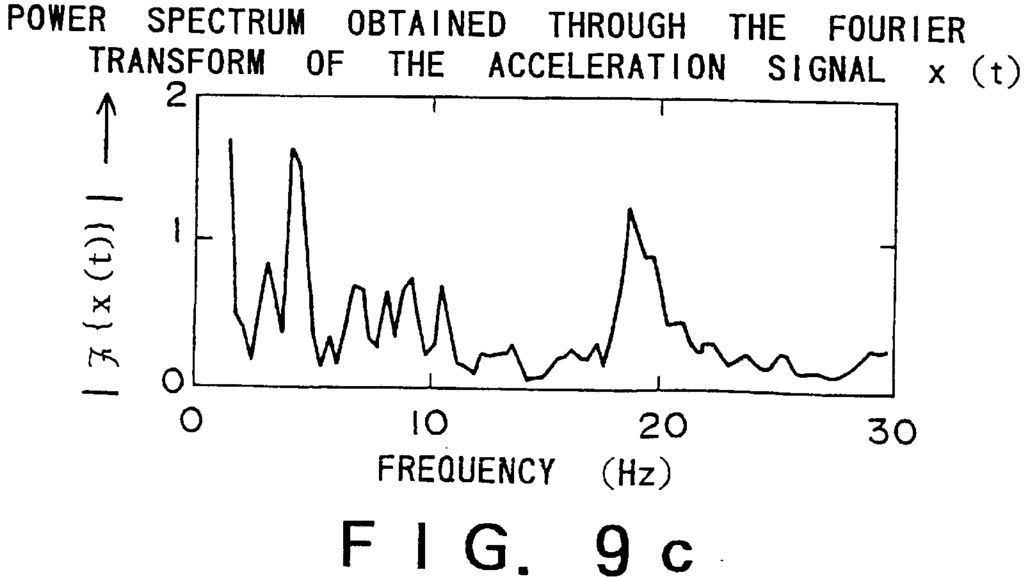

As shown in FIG. 9*a*, the cab acceleration signal x(t) provided by the acceleration sensor 20 disposed on the cab 54 is an unsteady signal in which frequency characteristic varies with speed, because the frequency of the irregular torque due to the eccentricity of the output shaft of the motor 51 varies in proportion to the cab speed as shown in FIG. 9*b*. Therefore, only a whole distribution of a power spectrum as shown in FIG. 9*c* is obtained and the dependence on the speed signal cannot be known through the simple Fourier transform of the cab acceleration signal x(t).

Figure 10:
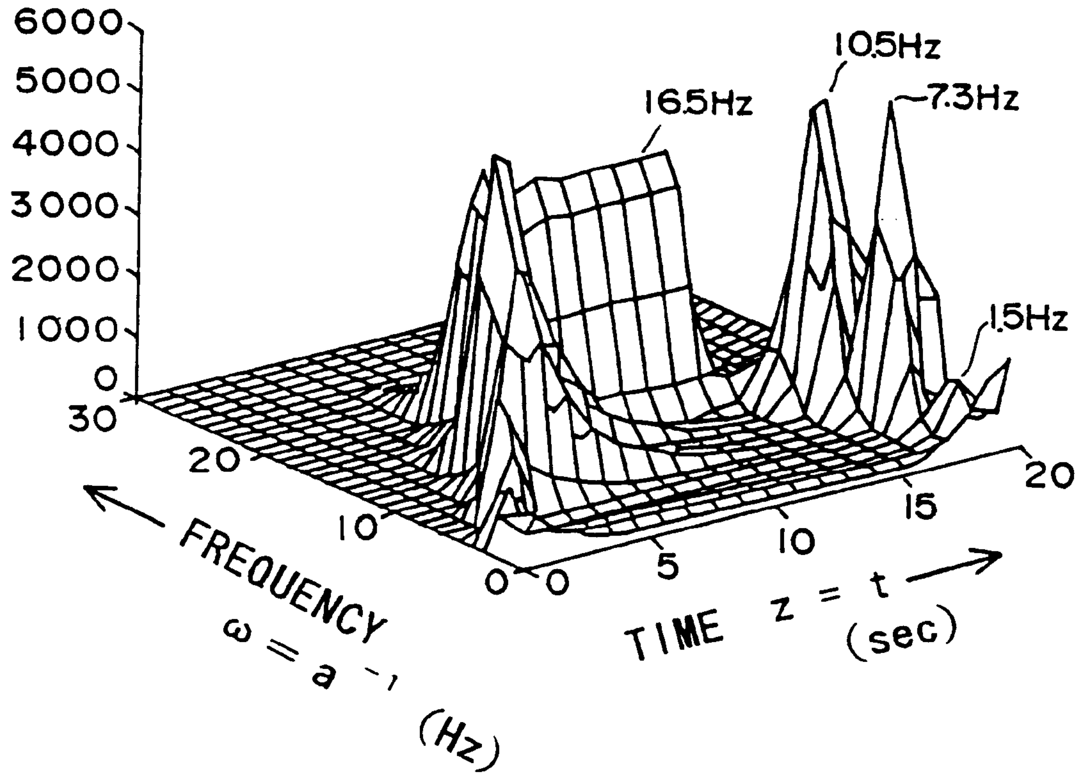
FIG. 10 is a graph showing the result of analysis of the acceleration of the cab of the elevator when the output shaft of the motor is eccentric by a conventional wavelet transform method.
Figure 11A:
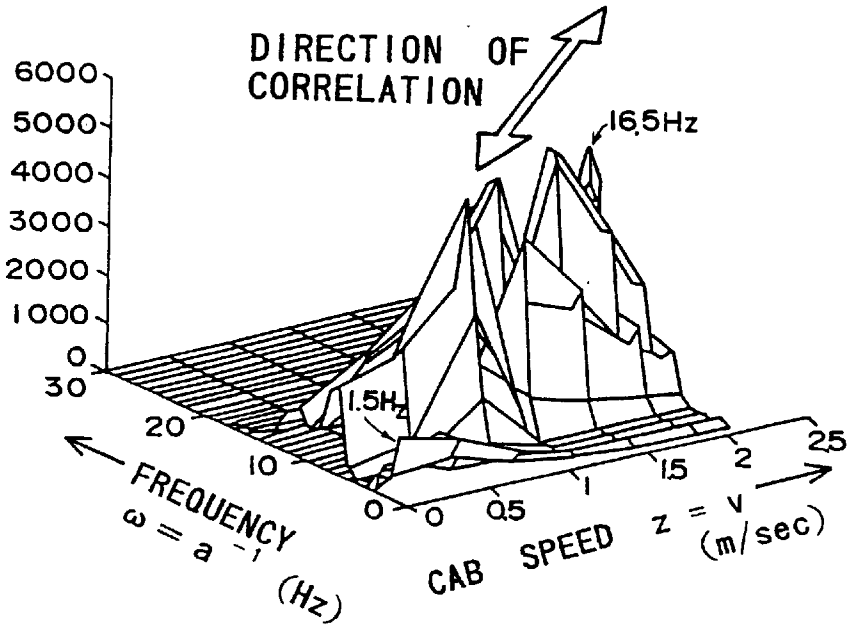
FIGS. 11*a* and 11*b* are graphs showing the result of extended wavelet transform of the acceleration of the cab of the elevator with respect to the speed of the cab when the output shaft of the motor is eccentric.
Figure 11B:
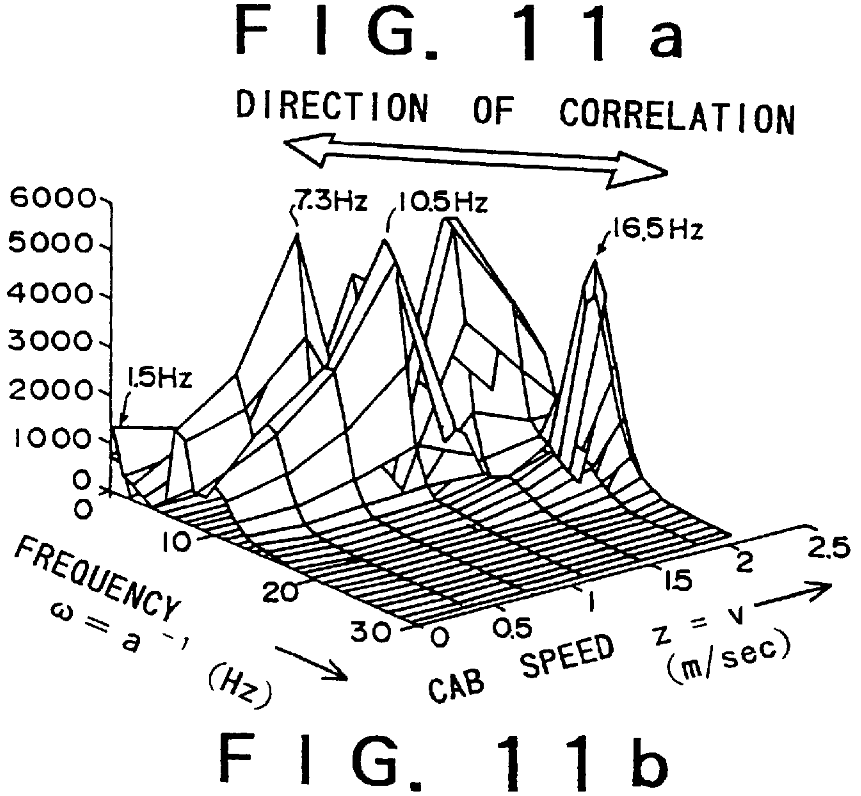
Figure 12:
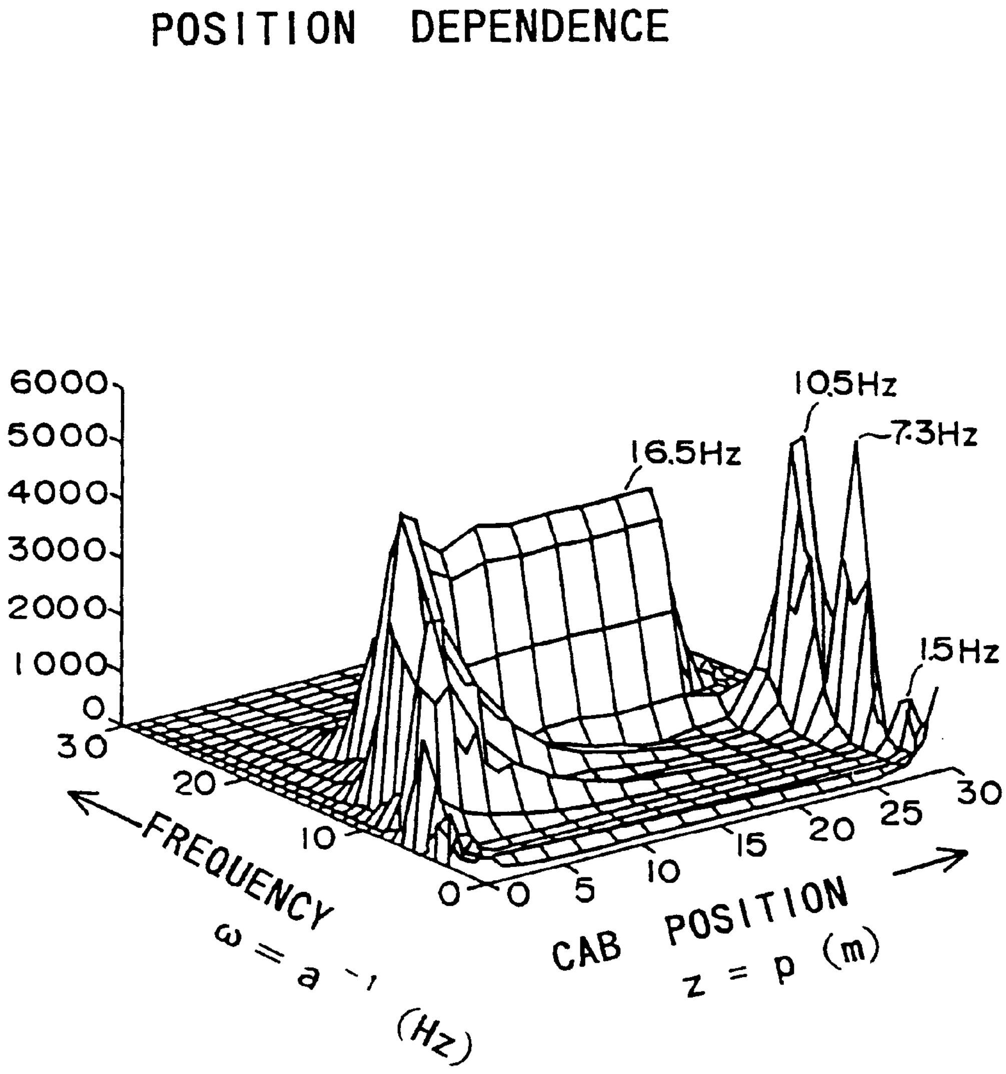
FIG. 12 is a graph showing the result of extended wavelet transform of the acceleration of the cab of the elevator with respect to the position of the cab when the output shaft of the motor is eccentric.

FIG. 10 is a graph showing the result of the conventional wavelet transform of the cab acceleration signal x(t), FIGS. 11*a* and 11*b* are graphs showing the result of the extended wavelet transform of the cab acceleration signal x(t) on the basis of the cab speed signal v(t), and FIG. 12 is a graph showing the result of the extended wavelet transform of the cab acceleration signal x(t) on the basis of the cab position signal p(t).

For example, it is known from wavelet spectra shown in FIGS. 11*a* and 11*b* that peaks of the spectra are on a line representing the proportional relation between the cab speed signal v(t) and the frequency $\omega = a^{-1}$. Thus, it is decided that there is some defective rotary member the rotary members of the elevator, and it is decided from the proportional relation between speed and frequency that the output shaft of the motor 51 is defective.

Figure 13A:
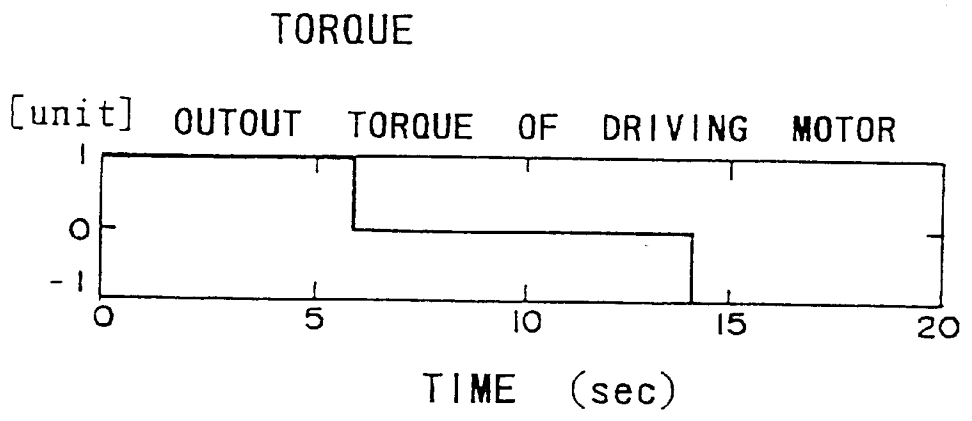
FIGS. 13*a*, 13*b* and 13*c* are graphs showing the variation with time of the output torque of the motor of the elevator, the speed of the cab of the elevator and the position of the cab of the elevator, respectively, when a guide rail included in the elevator is in a defective condition.
Figure 13B:
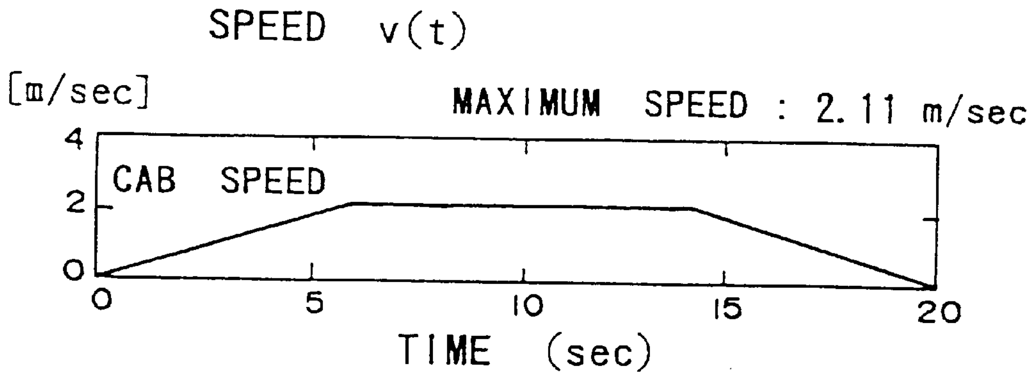
Figure 13C:
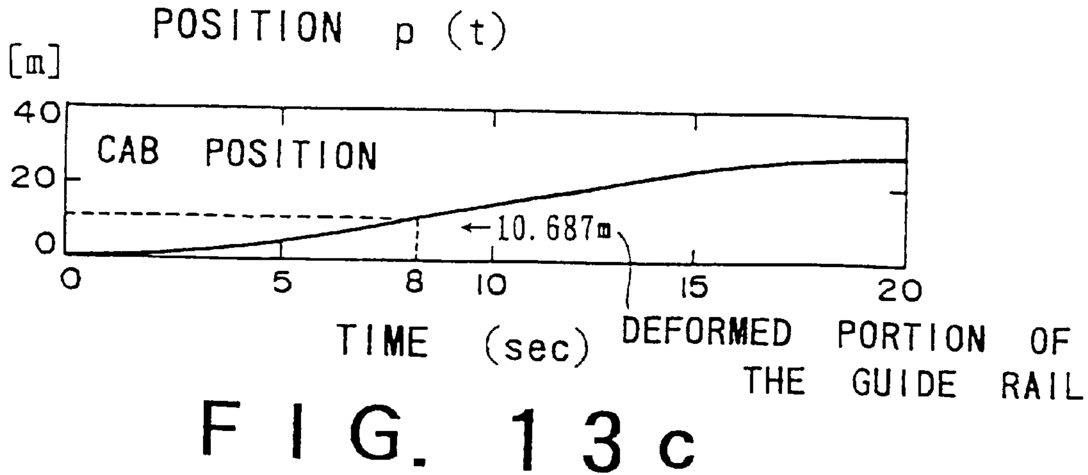
Figure 14A:
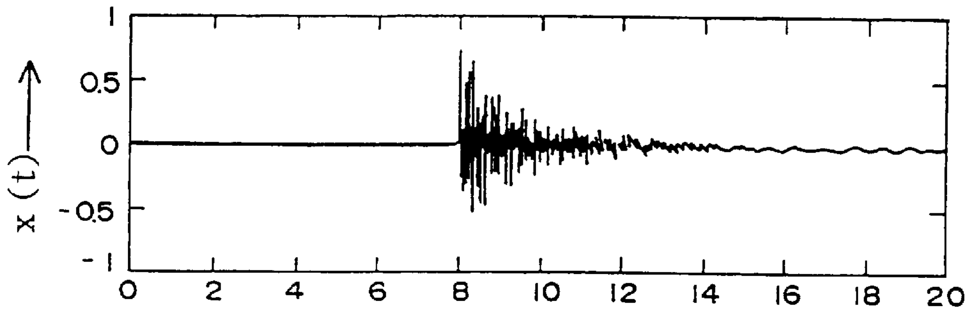
FIGS. 14*a* and 14*b* are graphs showing the acceleration of the cab of the elevator and the result of Fourier transform of the acceleration of the cab of the elevator, respectively, when the guide rail is in a defective state.
Figure 14B:
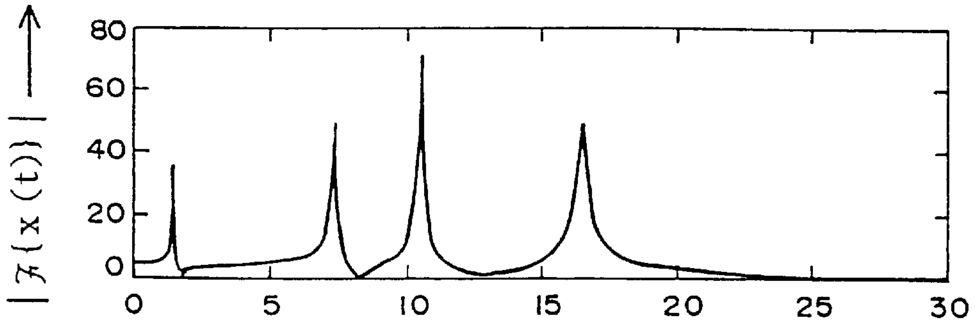

FIGS. 13*a* to 15 show the results of analysis of the unsteady signal when there is a defect in the guide rails 56 of the elevator. FIGS. 13*a*, 13*b* and 13*c* show the output torque of the motor 51, a cab speed signal v(t) and cab position signal p(t), respectively. FIGS. 14*a* and 14*b* show a cab acceleration signal x(t) and a power spectrum obtained by the Fourier transform of the cab acceleration signal x(t), respectively.

In this case, a step is existed in the joint of the guide rail 56 at a height of about 10.7 m, and the cab 54 moving upward is caused to started vibrating by an impulsive external force applied thereto by the step in the guide rail 56. It is impossible to know from the result of Fourier transform shown in FIG. 14*b* what applied the impulsive external force to the cab 54.

Figure 15:
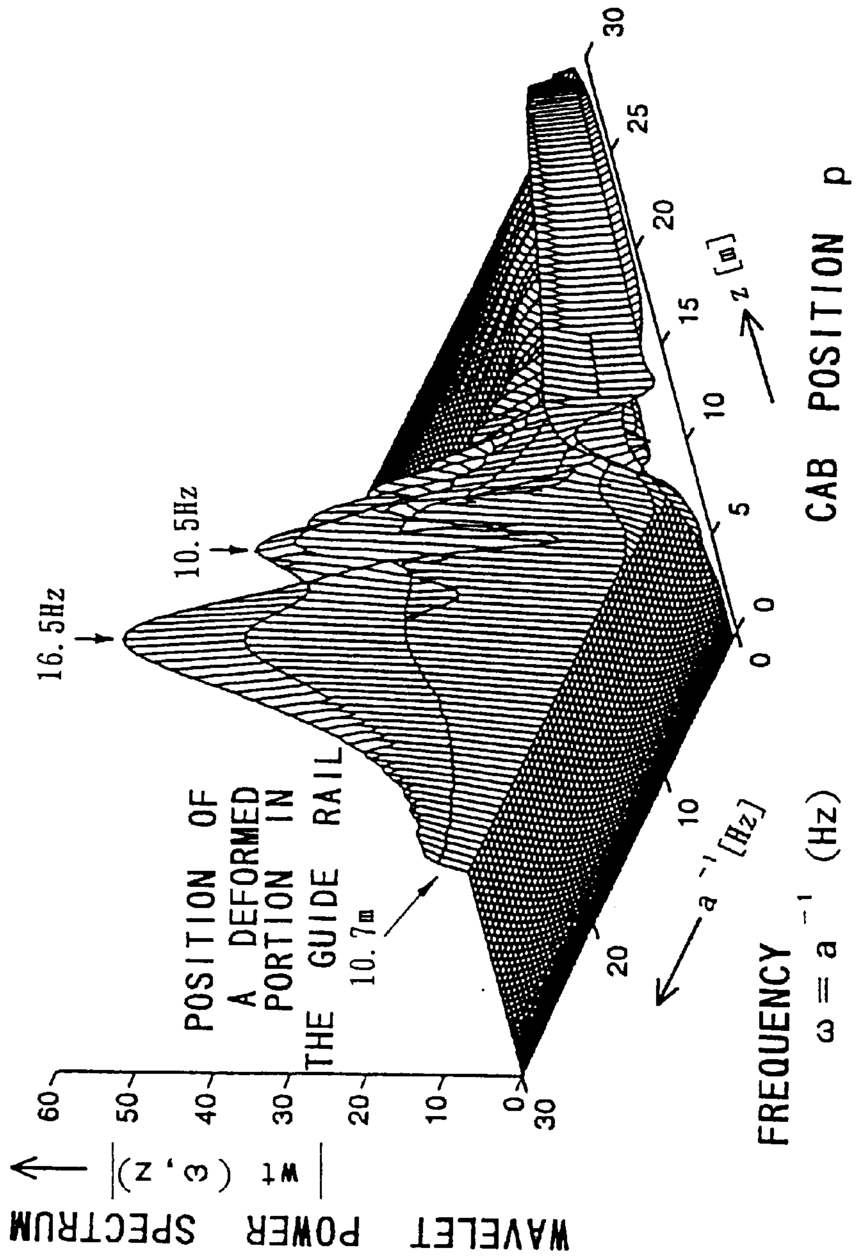
FIG. 15 is a graph showing the result of extended wavelet transform of the acceleration of the cab of the elevator When the guide rail is in a defective state.

FIG. 15 shows a wavelet power spectrum obtained through the extended wavelet transform of the cab acceleration signal x(t) with respect to the cab position signal p(t). As shown in FIG. 15, there is a sharp change in a portion of the spectrum corresponding to p=10.7 m on the cab position axis, and it is known that a defect exists at a position on the guide rail 56 corresponding to the position p=10.7 m of the cab 54.

As is apparent from the foregoing description, according to the present invention, the cab acceleration signal representing the acceleration of the cab 54 of the elevator is subjected to extended wavelet transform with respect to the cab speed, the variation of the output torque of the motor 51 can be found from the proportional relation between the frequencies of peaks in the extended wavelet spectrum and the cab speed, and the radius of the defective rotary member can be presumed from the proportional constant.

Similarly, defects in the guide rails 56 and the rope can be located from the variation of the extended wavelet spectrum obtained through the extended wavelet transform of the cab acceleration signal with respect to cab position.

Accordingly, the present invention improves the efficiency of operations for the monitoring and the maintenance of the elevator greatly. Accurate analysis and detection of defects can be achieved even if the cab of the elevator travels a short distance and only a small quantity of measured data is available.

When the present invention is applied to monitoring an elevator system, the correlation between the cab position located from the vibration spectrum included in the cab acceleration signal, and the cab speed can be clearly known, and the defects can be easily located.

Example 2

An unsteady signal analyzer embodying the present invention in Example 2 applied to a railroad car as a monitored object will be described hereinafter with reference to FIG. 16 and 17. Sometimes, the railroad car generates abnormal vibrations and noise due to the rotation of the abraded wheels or the action of distorted or warped rails, which could be causes of deteriorating a riding comfort, making passengers unpleasant, and causing a railroad accident. The unsteady signal analyzer included in a defect detecting system for the railroad car will be described hereinafter.

Figure 16:
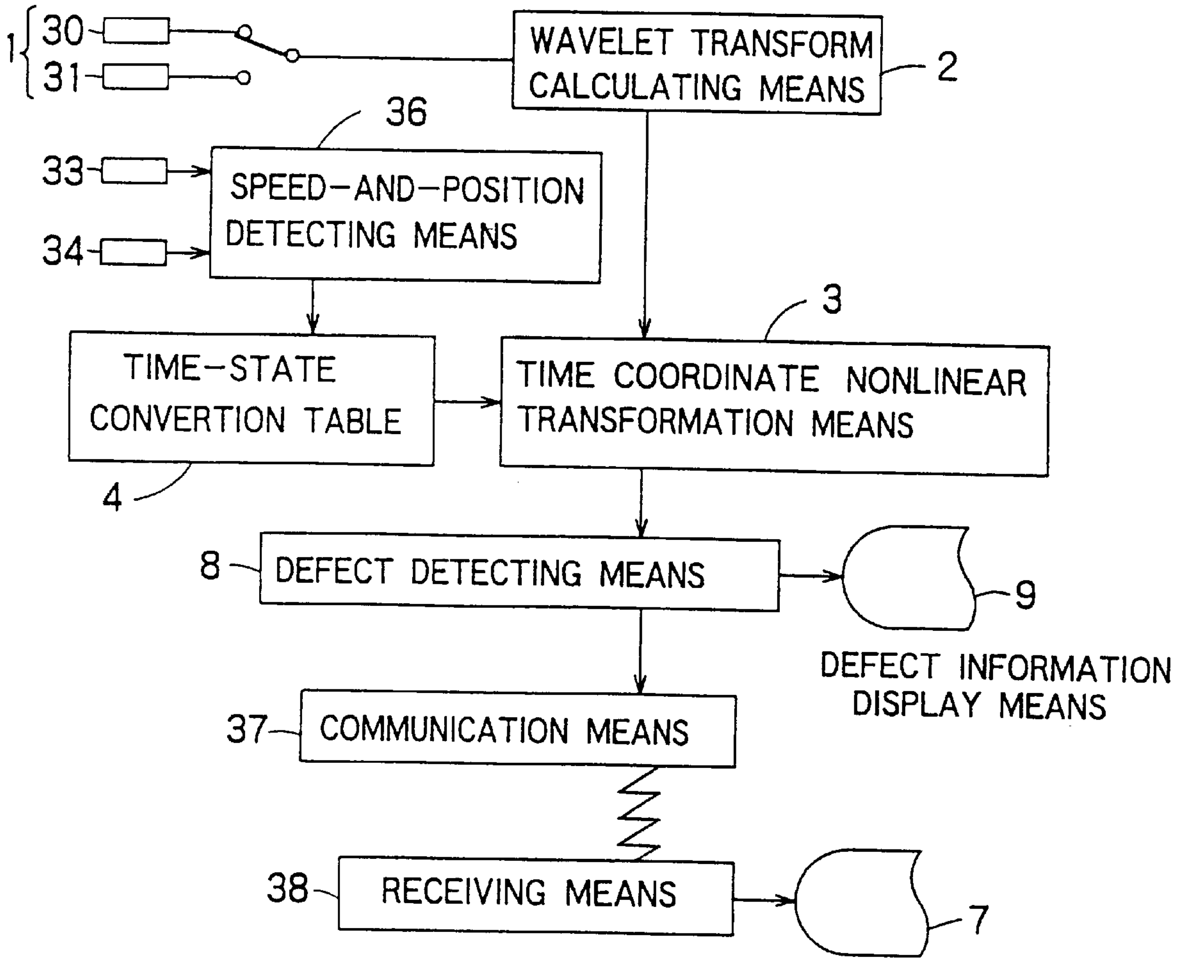
FIG. 16 is a block diagram of the unsteady signal analyzer embodying the present invention as applied to a railroad car.
Figure 17:
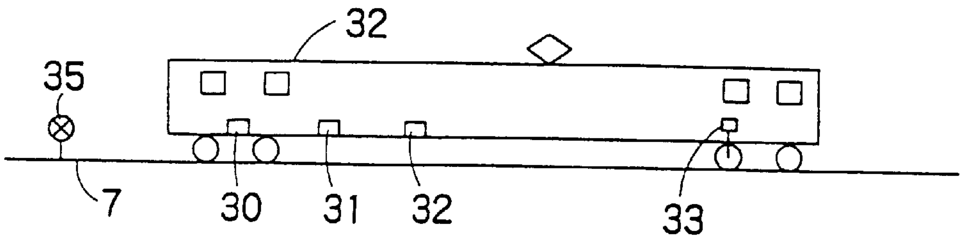
FIG. 17 is a schematic side view of a railroad car provided with the unsteady signal analyzer embodying the present invention.

FIG. 16 is a block diagram of the unsteady signal analyzer and FIG. 17 is a view of assistance in explaining the disposition of the unsteady signal analyzer on the railroad car.

Referring to FIG. 16, the unsteady signal analyzer in Example 2 is provided, as the response data measuring means 1, with an acceleration sensor 30 and a sound sensor 31 disposed on a railroad car 32 as shown in FIG. 17. The output signals of the acceleration sensor 30 and the sound sensor 31 serving as the response data measuring means 1 are given to the wavelet transform calculating means 2. The wavelet transform calculating means 2 transforms the output signals of the acceleration sensor 30 and the sound sensor 31 into wavelet spectra.

The railroad car 32 is provided with a position sensor 33 and an encoder 34, as shown in FIG. 17. The position sensor 33 recognizes distance marks 35 set on the track. The encoder 34 is connected with the wheel of the railroad car 32 to detect the rotating of the wheel.

As shown in FIG. 16, the unsteady signal analyzer is provided with a speed-and-position detecting means 36 which determines the traveling speed and the position, i.e., specific properties, of the train on the basis of signals provided by the position sensor 33 and the encoder 34, and produces time-position data or time-speed data. The time-position data or the time-speed data is stored in the time-state conversion table 4.

The wavelet spectrum calculated by the wavelet transform calculating means 2 is given to the time coordinate nonlinear transformation means 3. The time coordinate nonlinear transformation means 3 transforms the time coordinate of the wavelet spectrum into a position coordinate or a speed coordinate on the basis of the time-position data or the time-speed data to produce an extended wavelet spectrum.

The result of transformation made by the time coordinate nonlinear transformation means 3 is given to the defect detecting means 8. The defect detecting means 8 examines the result of transformation to decide whether or not there is any defect in the railroad car 32. When determining the condition of the railroad car 32 by one operating condition determining means, the defect detecting means 8 compares the extended wavelet spectrum with respect to position and frequency with a reference extended wavelet spectrum obtained previously under a normal condition, decides that something is wrong with the rail if the difference between the extended wavelet spectrum and the reference extended wavelet spectrum is not smaller than a threshold, and locates a defect on the rail.

When determining the condition of the railroad car 32 by another operating condition determining means, the defect detecting means 8 examines the condition of the railroad car 32 by comparing the extended wavelet spectrum with respect to speed and frequency with a reference extended wavelet spectrum obtained previously under a normal condition, and decides that something is wrong with the wheels of the railroad car 32 if the difference between the extended wavelet spectrum and the reference extended wavelet spectrum is not smaller than a threshold, and finds out a defective wheel.

The reference extended wavelet spectrum representing a normal operating condition, employed as a criterion for determining whether or not the operating condition of the railroad train 32 is normal, is produced beforehand on the basis of data representing the normal operating condition of the railroad car 32.

The result of examination made by the defect detecting means 8 is given to the defect information display means 9 (displaying and warning device). If anything wrong is found in the railroad car 32, the defect information display means 9 gives a warning to the operator. Information about the result of examination made by the defect detecting means 8 is transmitted by a cable or radio communication means 37 to a receiving means 38 installed in a train operation control center, and the information is displayed on a display means 7 installed in the train operation control center.

Although the unsteady signal analyzer in Example 2 is intended to carry out its functions in a real-time mode, the unsatisfactory signal analyzer may carry out its function in an off-line mode.

Although the unsteady signal analyzer in Example 2, i.e., a defect diagnosing system, is installed on the railroad car, the unsteady signal analyzer may be installed outside the railroad car, and the acceleration sensor 30 and the sound sensor 31 may be installed on the track.

Example 3

An unsteady signal analyzer embodying the present invention in Example 3 used as a general-purpose defect diagnosing system for analyzing defects in an unspecific monitored object will be described hereinafter with reference to FIGS. 18 to 21. The unsteady signal analyzer in Example 3 is a portable analyzer or a portable defect diagnosing apparatus integrally provided with sensors, arithmetic means and displaying means.

Figure 18:
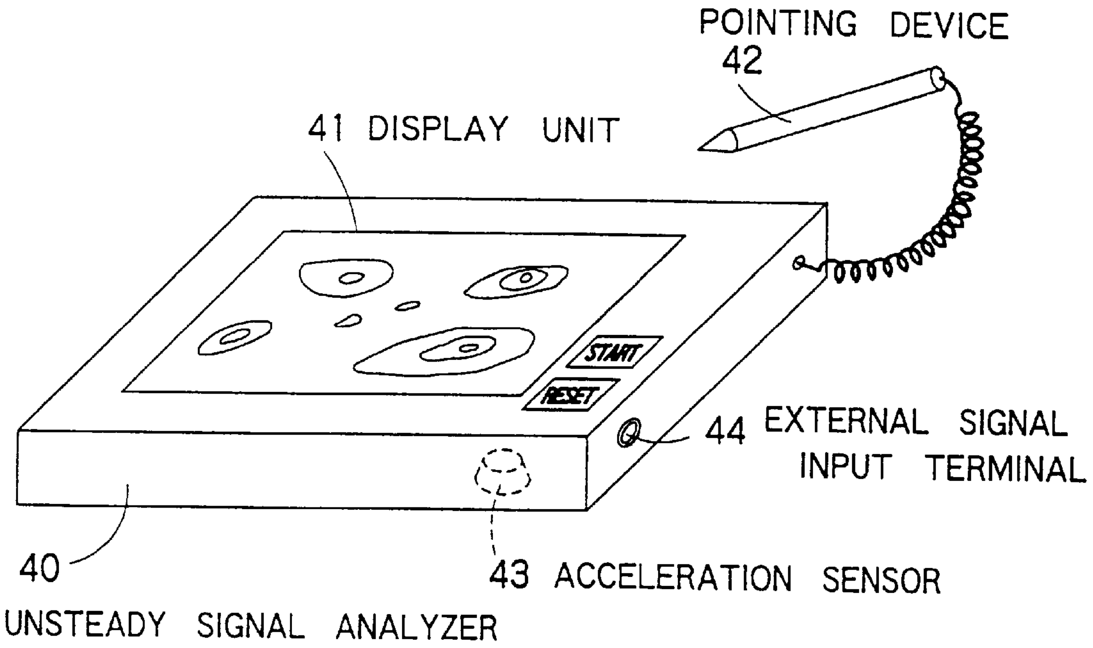
FIG. 18 is a perspective view of the unsteady signal analyzer embodying the present invention.
Figure 19:
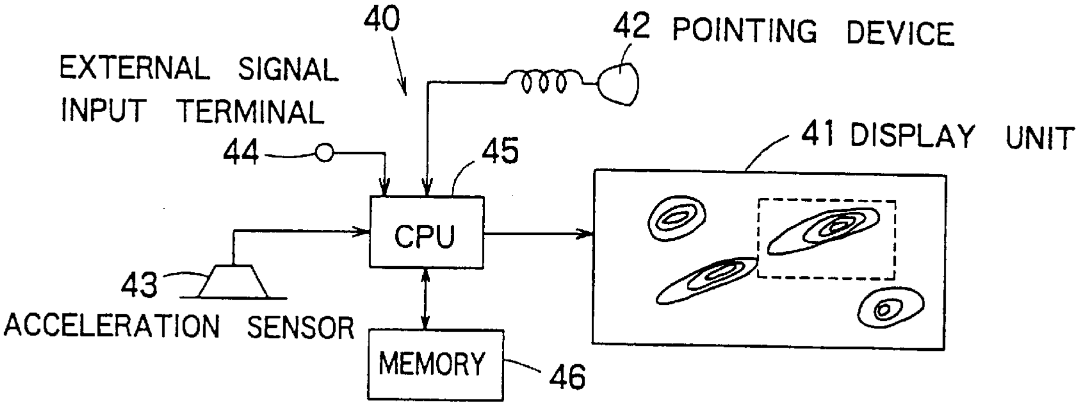
FIG. 19 is a block diagram of an internal device included in the unsteady signal analyzer embodying the present invention.

FIG. 18 is a perspective view of the unsteady signal analyzer 40, i.e., a general-purpose defect diagnosing apparatus, in Example 3, and FIG. 19 is a block diagram showing the internal configuration of the unsteady signal analyzer 40. Referring to FIGS. 18 and 19, the unsteady signal analyzer 40 has a display unit 41 for displaying an extended wavelet spectrum obtained through analysis. The display unit 41 allows the operator to specify a specific region on the screen thereof by a pointing device 42, such as an electronic pen or a mouse.

The unsteady signal analyzer 40 is provided with an internal acceleration sensor 43, i.e., a response data measuring means, and an external signal input terminal 44. An acceleration signal provided by the acceleration sensor 43 and an external signal received through the external signal input terminal 44 are transferred to an internal central processing unit (CPU) 45. Information provided by sensors are stored in a storage device 46 connected to the CPU 45. The CPU 45 carries out operations for extended wavelet transform.

Figure 20:
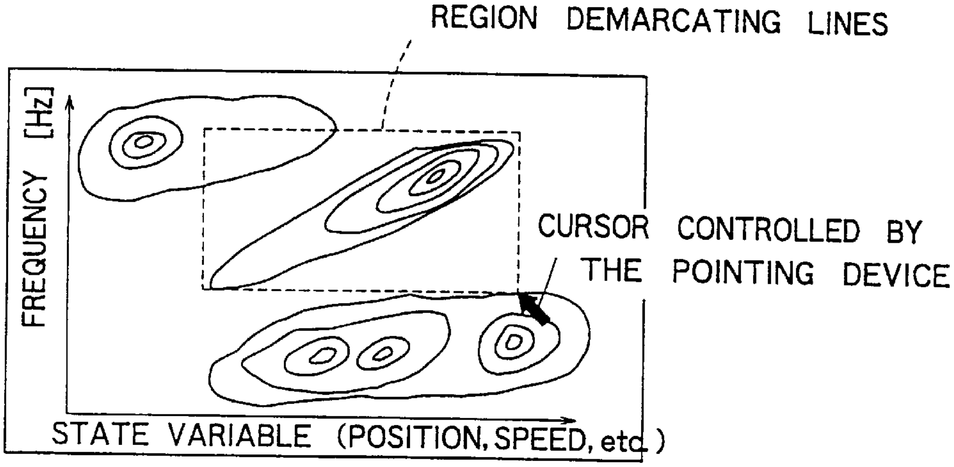
FIG. 20 is a pictorial view showing, by way of example, data displayed on a display unit included in the unsteady signal analyzer embodying the present invention.

FIG. 20 shows, by way of example, an extended wavelet spectrum displayed on the screen of the display unit 41, in which the specific state variable, such as the position or the speed of the monitored object, is measured on the horizontal axis, frequency is measured on the vertical axis, and the magnitude of power of the extended wavelet spectrum is represented by contour lines. The magnitude of power of the extended wavelet spectrum may be represented by colors.

The operator operates the pointing device 42, such as an electronic pen or a mouse, to demarcate a specific region of an optional shape to be subjected to diagnosis by lines on the screen. Then, data represented by the demarcated region of the extended wavelet spectrum is extracted and the extracted data is subjected to a defect detecting procedure. The defect detecting process may be carried out on an assumption that the values of portions of the extended wavelet spectrum in regions on the screen other than the demarcated region are zero.

Figure 21:
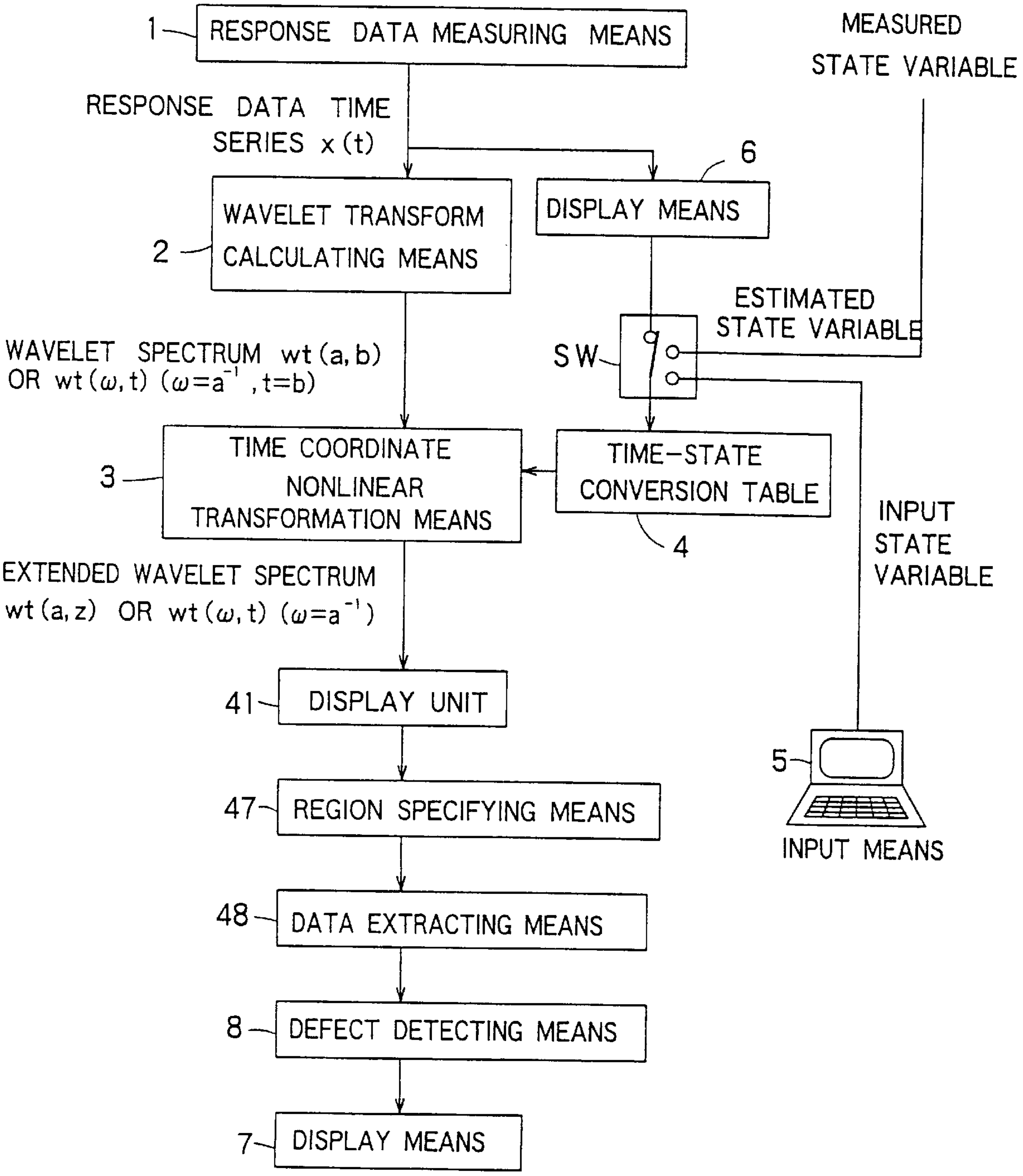
FIG. 21 is a block diagram of the unsteady signal analyzer embodying the present invention.

The defect detecting procedure to be carried out after the demarcation of the region will be explained with reference to FIG. 21, in which indicated at 47 is a region specifying means including the pointing device 42, and at 48 is a data extracting means for extracting the data representing the demarcated region of the extended wavelet spectrum or for setting portions of the extended wavelet spectrum in regions on the screen other than the demarcated region to zero.

The thus processed data is given to the defect detecting means 8, and then the defect detecting means 8 carries out operations expressed by Expressions (12) and (13) to decide whether or not there is any defect in the monitored object. The display means 7 displays the results of decision made by the defect detecting means 8. The display unit 41 may be used as the display means 7.

Since a portion of the extended wavelet spectrum displayed by the display unit 41 can be specified and extracted by the region specifying means 47 and the data extracting means 48, the operator is able to specify a portion of the extended wavelet spectrum displayed by the display unit 41, having features distinct from those of a normal condition to analyze only the specified portion by the defect detecting means 8. Accordingly, defect detection can be achieved in an improved accuracy without being affected by noise, disturbances and other factors included in regions other than the specified region.

As is apparent from the foregoing description, the unsteady signal analyzer according to the present invention is capable of surly detecting defects in the monitored object through the determination of the dependence of the variation of frequency on the specific state variable of the monitored object, and the correlation between the specific state variable and the variation of the frequency.

Second Embodiment

A recording medium storing an unsteady signal analyzing program in a preferred second embodiment according to the present invention will be described with reference to FIGS. 22 and 23.

The recording medium storing an unsteady signal analyzing program in the second embodiment is a computer readable recording medium.

The unsteady signal analyzing program makes the computer exercise the functions of the wavelet transform calculating means 2, the time coordinate nonlinear transformation means 3, and the state variation function setting means, namely the time-state conversion table 4 and the state estimating means 6.

The unsteady signal analyzing program can include an additional program which make the computer exercise the function of the defect detecting means 8.

The analyzing steps performed by the program of this embodiment are the same as the steps of the aforesaid first embodiment and its modification, and the aforesaid examples 1 to 3 of the first embodiment.

Figure 22:
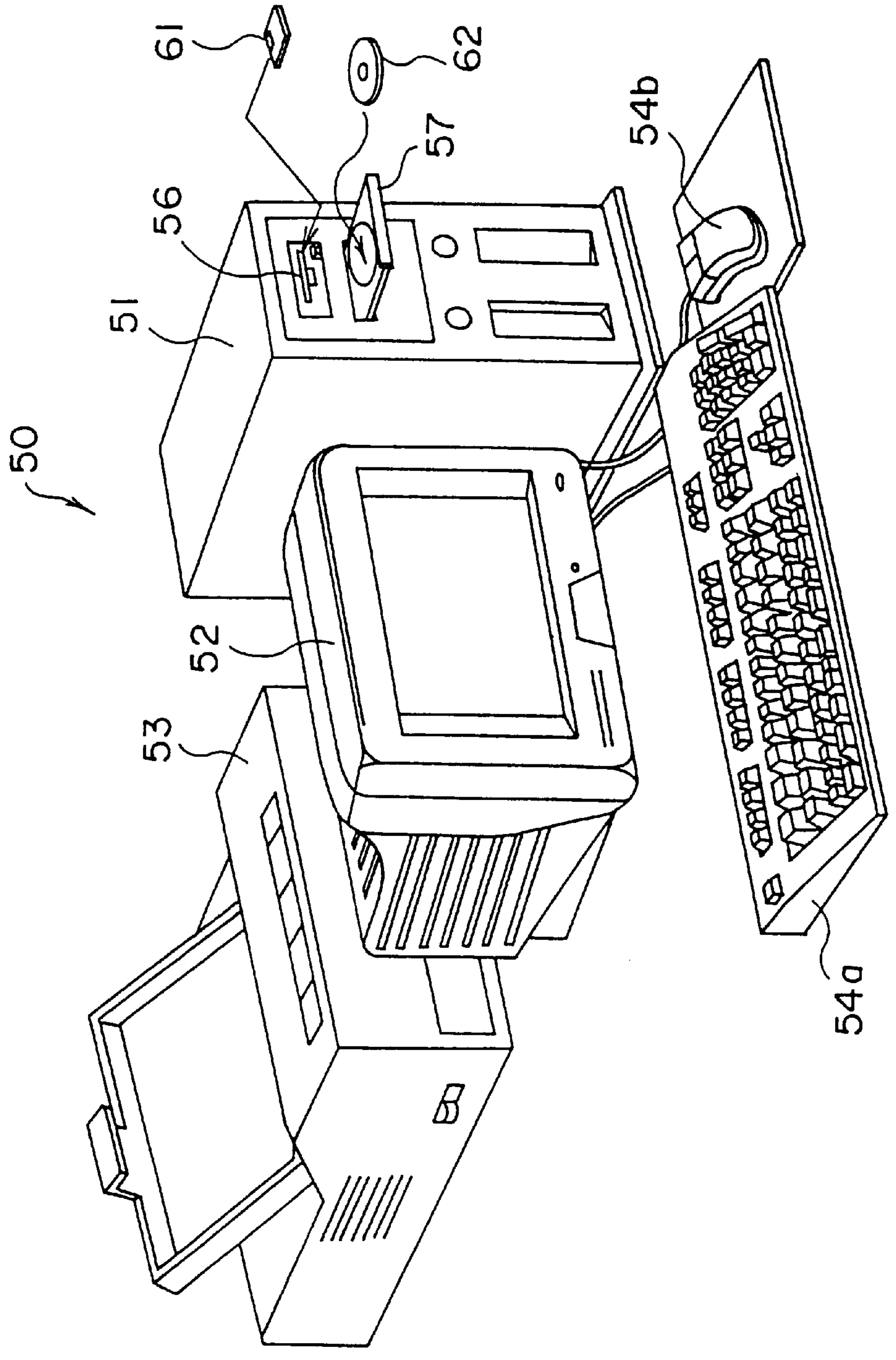
FIG. 22 is a perspective view of a computer system which is used to read the unsteady signal analyzing program stored in the recording medium in a preferred second embodiment according to the present invention.

FIG. 22 is a perspective view of a computer system which is used to read the unsteady signal analyzing program stored in the recording medium in the second embodiment according to the present invention. The program stored in the recording medium of this embodiment is read by recording medium drive means incorporated in the computer system 50 as shown in FIG. 22 to be used for analyzing an unsteady signal.

As shown in FIG. 22, the computer system 50 comprises a computer body 51 accommodated in a casing, such as a minitower or the like, display means 52, such as a CRT (Cathode Ray Tube), a plasma display, LCD (Liquid Crystal Display) or the like, a printer 53 as record output means, a keyboard **54*a* and a mouse 54*b* as input means, flexible disk drive means 56 and a CD-ROM drive means 57**.

Figure 23:
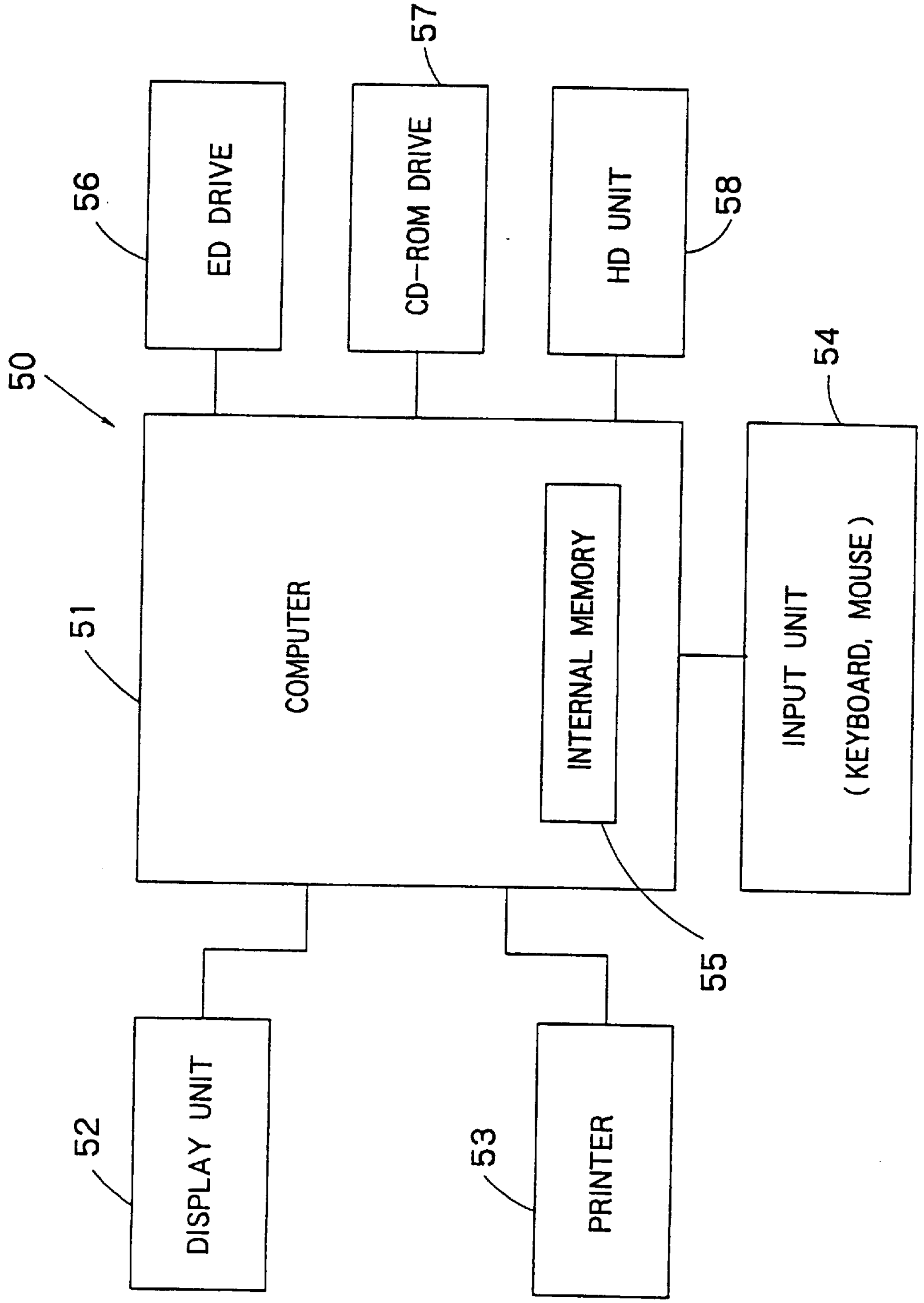
FIG. 23 is a block diagram of the computer system which is used to read the unsteady sinal analyzing program stored in the recording medium in the second embodiment.

FIG. 23 is a block diagram of the computer system which is used to read the unsteady sinal analyzing program stored in the recording medium in the second embodiment. The casing accommodating the computer body 51 further accommodates an internal memory 55, such as a RAM (Random Access Memory) or the like, and an external memory, such as a hard disk drive unit 58 or the like.

As shown in FIG. 22, the flexible disk 61 recording the analyzing program is inserted into a slot of the flexible disk drive means 56 and is read based on a proper application program. The recording medium is not limited to the flexible disk 61 and may be a CD-ROM (Read Only Memory) 62. The recording medium may be a MO (Magneto Optical) disk, an optical disk, a DVD (Digital Versatile Disk), card memory, magnetic tape or others which are not shown.

The unsteady signal analyzer and the recording medium storing unsteady signal analyzing program according to the present inventions are widely applicable to analyze an unsteady state of a monitored object, such as an elevator or a railroad car, by getting the correlation and the causal relationship between the specific state variable of the monitored object and the frequency changes.

What is claimed is:

1. An unsteady signal analyzer for analyzing an unsteady signal generated by a monitored object, comprising:

wavelet transform calculating means for producing a wavelet spectrum data through a wavelet transform of the unsteady signal;

state variation function setting means for setting a state variation function representing a variation of a specific state variable of the monitored object with time; and time coordinate nonlinear transformation means for transforming a time coordinate of the wavelet spectrum data nonlinearly into a coordinate of the specific state variable by using an inverse function of the state variation function set by the state variation function setting means.

2. An unsteady signal analyzer for analyzing an unsteady signal representing an acceleration of a cab included in an elevator as a monitored object, comprising:

wavelet transform calculating means for producing a wavelet spectrum data through a wavelet transform of the unsteady signal representing a measured acceleration of the cab;

state variation function setting means for setting a state variation function representing a variation of vertical position or vertical speed as a state variable of the cab with time; and time coordinate nonlinear transformation means for transforming a time coordinate of the wavelet spectrum data nonlinearly into a coordinate of the vertical position or the vertical speed by using an inverse function of the state variation function set by the state variation function setting means.

3. The unsteady signal analyzer according to claim 1 wherein the time coordinate nonlinear transformation means transforms the time coordinate of the wavelet spectrum data nonlinearly into the coordinate of the specific state variable by using following expression:

$$wt(a, b) = \int_{z(-\infty)}^{z(\infty)} \frac{1}{\sqrt{|a|}} \phi\left(\frac{t(z-b)}{a}\right) x(t(z)) \frac{dt(z)}{dz} \, dz$$

which is expressing an extended wavelet transform.

4. The unsteady signal analyzers according to claim 1, wherein the time coordinate nonlinear transformation means divides the wavelet spectrum data with respect to time into data segments, rearranges the data segments in order of magnitude of the state variable on the basis of a data table showing the relation between time and the state variable, or the state variation function, and estimates intermediate values of the data segments by interpolation and smoothing techniques, so as to transform the time coordinate of the wavelet spectrum data nonlinearly into the coordinate of the specific state variable.

5. The unsteady signal analyzer according to of claim 1 further comprising a response data measuring means for measuring the unsteady signal.

6. The unsteady signal analyzers according to of claim 1, wherein the state variation function setting means estimates the state variation function on the basis of measured data on a state variable of the monitored object other than the specific state variable.

7. The unsteady signal analyzer according to claim 6, wherein the measured data on the state variable of the monitored object other than the specific state variable is measured data on the unsteady signal.

8. The unsteady signal analyzer according to claim 6, wherein the state variation function setting means estimates the state variation function through an estimation of a variation of the specific state variable with time on the basis of the measured data on the state variable of the monitored object other than the specific state variable by using a state observer system based on a dynamic characteristic model of the monitored object or a Kalman filter.

9. The unsteady signal analyzer according to of claim 1, wherein the state variation function setting means determines the state variation function on the basis of measured data on the specific state variable.

10. The unsteady signal analyzer according to of claim 1, wherein the state variation function used by the state variation function setting means is determined beforehand.

11. The unsteady signal analyzer according to of claim 1, further comprising a display means for displaying the results of analysis made by the time coordinate nonlinear transformation means on a coordinate system indicating at least coordinates of the specific state variable and the frequency.

12. The unsteady signal analyzer according to claim 11 further comprising a defect detecting means for detecting a defect in the monitored object on the basis of the results of analysis made by the time coordinate nonlinear transformation means.

13. The unsteady signal analyzer according to claim 12 further comprising:

a region specifying means for specifying a specific region in the wavelet spectrum obtained as a result of analysis by the time coordinate nonlinear transformation means and displayed on the display means, and a data extracting means for extracting data on a portion of the spectrum, in the specific region specified by the region specifying means, and sending the extracted data on the portion of the spectrum to the defect detecting means.

14. The unsteady signal analyzer according to claim 12, wherein a result of detection made by the defect detecting means is displayed on the display means.

15. The unsteady signal analyzer according to of claim 12 further comprising a defect display means for displaying a result of detection made by the defect detecting means.

16. A recording medium storing an unsteady signal analyzing program defining a procedure for analyzing an unsteady signal generated by a monitored object, to be carried out by a computer, the unsteady signal analyzing program makes the computer exercise:

a wavelet transform calculating function of producing a wavelet spectrum data through a wavelet transform of the unsteady signal;

a state variation function setting function of setting a state variation function representing a variation of a specific state variable of the monitored object with time; and a time coordinate nonlinear transformation function of transforming a time coordinate of the wavelet spectrum data nonlinearly into a coordinate of the specific state variable by using an inverse function of the state variation function.

17. The recording medium storing the unsteady signal analyzing program, according to claim 16, wherein the monitored object is an elevator, the unsteady signal is an acceleration signal representing the measured acceleration of a cab included in the elevator, and the specific state variable is vertical position or vertical speed of the cab.

18. The recording medium storing the unsteady signal analyzing program, according to claim 16, wherein the time coordinate nonlinear transformation function carries out the nonlinear transformation of the time coordinate of the wavelet spectrum data by using following expression:

$$wt(a, b) = \int_{z(-\infty)}^{z(\infty)} \frac{1}{\sqrt{|a|}} \phi\left(\frac{t(z-b)}{a}\right) x(t(z)) \frac{dt(z)}{dz} dz$$

which is expressing an extended wavelet transform.

19. The recording medium storing the unsteady signal analyzing program, according to claim 16, wherein the time coordinate nonlinear transformation function divides the wavelet spectrum data with respect to time into data segments, rearranges the data segments in order of magnitude of the state variable on the basis of a data table showing the relation between time and the state variable, or the state variation function, and estimates intermediate values of the data segments by interpolation and smoothing techniques, so as to transform the time coordinate of the wavelet spectrum data nonlinearly into the coordinate of the specific state variable.

20. The unsteady signal analyzer according to claim 2, wherein the time coordinate nonlinear transformation means transforms the time coordinate of the wavelet spectrum data nonlinearly into the coordinate of the specific state variable by using the following expression: which is expressing $$wt(a, b) = \int_{z(-\infty)}^{z(\infty)} \frac{1}{\sqrt{|a|}} \phi\left(\frac{t(z-b)}{a}\right) x(t(z)) \frac{dt(z)}{dz} dz$$

an extended wavelet transform.

* * * * *